(12) United States Patent
Magoon et al.

(10) Patent No.: US 6,707,326 B1
(45) Date of Patent: Mar. 16, 2004

(54) PROGRAMMABLE FREQUENCY DIVIDER

(75) Inventors: Rahul Magoon, Irvine, CA (US); Alyosha C. Molnar, Costa Mesa, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/370,099

(22) Filed: Aug. 6, 1999

(51) Int. Cl.[7] .................. H03K 21/00; H03K 23/00; H03K 25/00
(52) U.S. Cl. .................. 327/115; 377/47; 377/48
(58) Field of Search .................. 327/115, 117, 327/113, 114; 377/47, 48

(56) References Cited

U.S. PATENT DOCUMENTS 4,606,059 A * 8/1986 Oida .................. 377/108
5,077,764 A * 12/1991 Yamashita .................. 377/108
5,425,074 A * 6/1995 Wong .................. 377/47
5,557,649 A * 9/1996 Scheckel et al. .................. 377/110
5,841,302 A * 11/1998 Ishii et al. .................. 327/117
5,859,890 A * 1/1999 Shurboff et al. .................. 377/47

* cited by examiner

Primary Examiner—Tuan T. Lam
(74) Attorney, Agent, or Firm—Mintz Levin Cohn Ferris Glovsky & Popeo, P.C.

(57) ABSTRACT

A programmable frequency divider capable of a 50% duty cycle at odd and even integer division ratios. In one embodiment, the frequency divider is configured to produce an output signal having a period equal to a division ratio N times a period of a clock signal, and the division number N is a programmable variable which bears the following relationship to the number F of required storage elements:

$$F = \frac{N+P}{2},$$

where P is 1 if the division ratio is odd, and 0 if the division ratio is even.

16 Claims, 20 Drawing Sheets

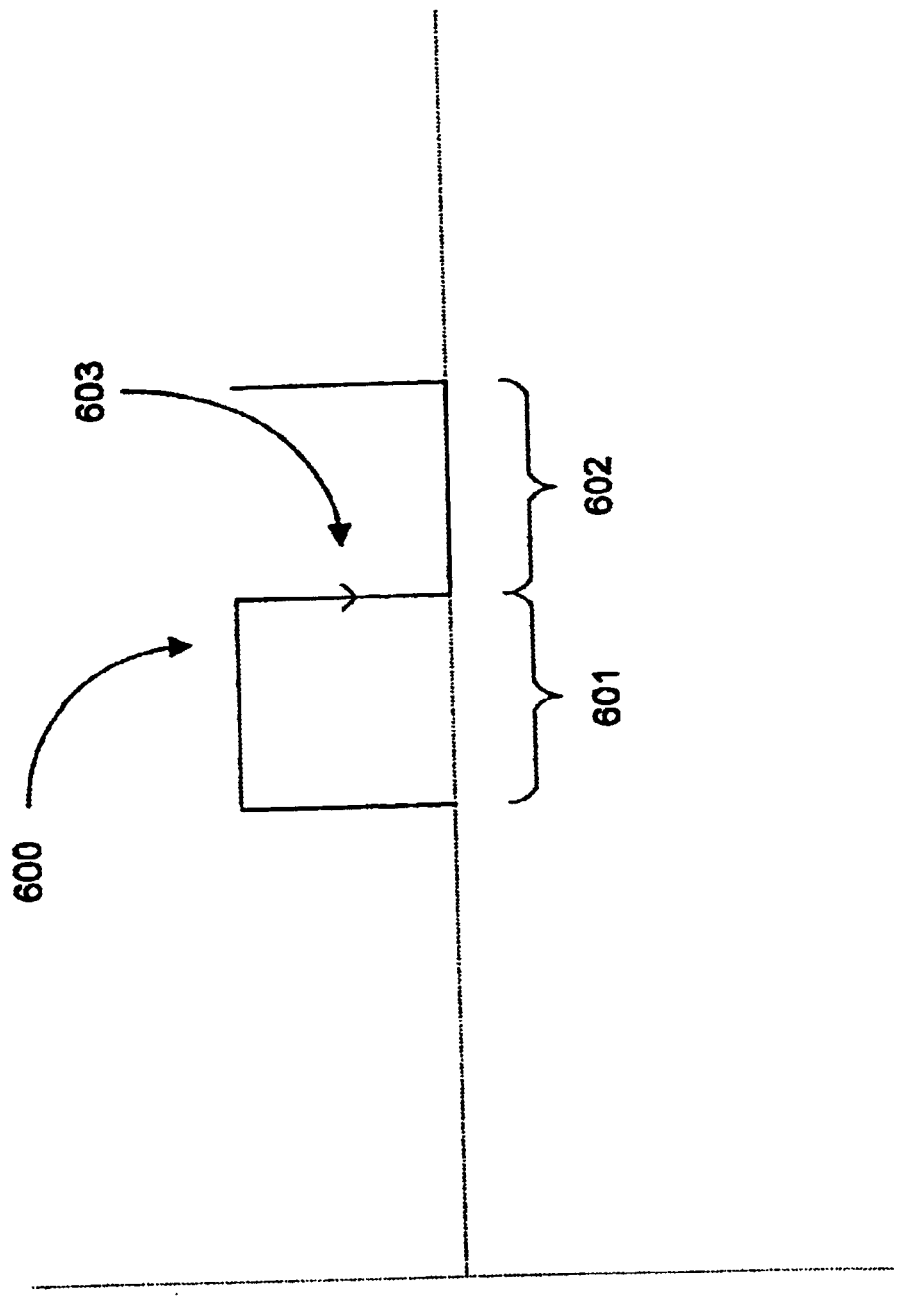

PROGRAMMABLE FREQUENCY DIVIDER

BACKGROUND OF THE INVENTION

I. Field of the Invention

This invention relates to the field of frequency dividers, and more specifically, programmable frequency dividers capable of a 50% duty cycle for odd and even integer divide ratios.

II. Background of the Invention

In order to provide greater flexibility in frequency planning, a competitive integrated circuit (IC)-based high frequency transceiver requires fully programmable frequency division. For example, in the receiver portion of the transceiver, a local oscillator (LO) frequency is typically a multiple of a certain reference frequency, and a programmable frequency divider is included in a phase locked loop (PLL) to generate the correct LO frequency. In the transmitter portion of the transceiver, a programmable frequency divider is typically included in the translational loop to generate the necessary radio (RF) or intermediate frequency (IF).

Conventional approaches employing counters or cascaded flip-flops may not be acceptable in every situation because they are incapable of producing an output having a 50% duty cycle, no matter what the integer divide ratio, or are incapable of doing so at odd integer divide ratios. FIG. 1A illustrates a clock signal, and FIG. 1B illustrates an output signal representing a division ratio of 3 obtained from a conventional frequency divider. As can be seen, the duty cycle of the signal, representing the fraction of a period the signal is in a high state, deviates substantially from 50%. A 50% duty cycle in the output signal is preferred because such signals lack even harmonics. Even harmonics in the output signal are sought to be avoided because they may cause spurious effects in many high frequency applications. For example, in integrated circuits, the introduction of even harmonics defeats the purpose of using purely differential mode signals.

Consequently, there is a need for a programmable frequency divider that is capable of producing a 50% duty cycle in the output signal at all integer divide ratios, both odd and even.

SUMMARY OF THE INVENTION

In accordance with the purpose of the invention as broadly described herein, there is provided a frequency divider configured to provide an output signal having a period equal to a period of a clock signal multiplied by a division ratio, the frequency divider comprising a plurality of edge triggered storage elements arranged in at least one loop, each of the elements having a state, and a clock input, wherein the state of each storage element is determined responsive to a transition of the clock input, the state, or the inverse thereof, of one or more previous elements in the loop, a characteristic of the division ratio, and the previous state, or the inverse thereof, of the storage element, and the output signal is derived from the state, or the inverse thereof, of at least one of the elements in the loop. In one implementation, the division ratio N which is achieved is related to the number of storage elements F by the following equation:

$$F = \frac{N + P}{2}$$

where P is 1 if the division ratio is odd, and 0 if the division ratio is even. Thus, for example, a division ratio of either 5 or 6 could be achieved with 3 storage elements.

In one embodiment, the loop is configured such that an odd number of loop inversions are present in the loop. In one implementation, the loop inversions are implemented through inverters. In another implementation, the loop inversions are implemented through suitable routing of differential mode lines or signals.

In one implementation, each of the storage elements is configured to normally trigger on a first edge of the clock signal, and to trigger on a second edge of the clock signal if the control signal is in a first predetermined state and the data output of the storage element is in a second predetermined state. In one implementation example, the first predetermined state of the control signal indicates that the division ratio is an odd integer, and the second predetermined state of the data output is a logical high. Thus, in this implementation example, each of the storage elements normally triggers on a first edge of the clock signal, and triggers on a second edge of the clock signal if the control signal indicates an odd integer division ratio and the data output of the storage element is high.

In a second embodiment, the number of storage elements which contributes to the frequency division function is determined responsive to the desired division ratio. This number may be less than the number of storage elements physically present. In this embodiment, a circuit, responsive to the desired division ratio, configures the loop with the number of storage elements which are necessary to achieve the desired division ratio.

In one implementation, the number F of storage elements needed to perform the frequency division operation is determined by the equation:

$$F = \frac{N + P}{2}$$

where N is the desired division ratio, and P is 1 if the desired division ratio is odd, and 0 if the desired division ratio is even. Once F is determined, a series F of storage elements is selected from a physical sequence. A multiplexor forms the loop from these F elements. Any remaining storage elements in the sequence are unused.

In a third embodiment, a power saving feature is provided in which unused storage elements are placed in a power saving mode. In one implementation, each of the control and clock signal inputs to a storage element are configured as current mode signals in which a logical '1' is represented through a current flow in a direction towards ground, and a logical '0' is represented by the lack of such a current flow. Each of these current mode signals is configured with a transistor which is provided along the flow path of the current mode signal to ground. All of these transistors for a given storage element are turned off if the storage element is unused for a given application.

In one implementation of the invention, each storage element comprises a flip-flop coupled to a clock phase module which selectively alters the phase of the clock signal responsive to the state of the control signal and the data output of the flip-flop. In one example, each storage element is configured to normally trigger on a rising edge of the clock signal, and to trigger on the falling edge in the exceptional case. In this example, the clock phase module inverts the phase of the clock to the flip-flop if the control signal indicates that the division ratio is an odd integer, and the data output of the storage element is in a logical high state, but otherwise leaves the phase of the clock unchanged.

In one example application, the frequency divider of the invention is a component of a frequency synthesizer which in turn is a component of a transceiver. The transceiver, in turn, may be a component of a wireless communications device, including a mobile wireless communication device such as a mobile wireless handset. The device in turn may be included in a wireless communications system of the type in which a geographical area is divided into a plurality of cells, and a base station in included within each cell. The base station for a cell communicates with one or more mobile wireless devices within the cell through a wireless communications interface.

In another example application, the frequency divider of the invention is a component of a translation loop which forms the transmitter section of a transceiver. The transceiver, in turn, may be a component of a wireless communications device, including a mobile wireless communication device such as a mobile wireless handset. The device in turn may be included in a wireless communications system of the type in which a geographical area is divided into a plurality of cells, and a base station in included within each cell. The base station for a cell communicates with one or more mobile wireless devices within the cell through a wireless communications interface.

A related method of operation for a storage element in accordance with the subject invention comprises the steps of triggering upon a first edge of the clock signal if the desired division ratio N has a first predetermined characteristic or the data output of the storage element is in a first predetermined state, and triggering upon a second edge of the clock signal if the desired division ratio N has a second predetermined characteristic and the data output of the storage element is in a second predetermined state. In one implementation, the first predetermined characteristic of the division ratio is that it be an even integer, and the second predetermined characteristic of the division ratio is that it be an odd integer. In addition, in this implementation, the first predetermined state of the data output of the storage element is a logical low, and the second predetermined state of the data output of the storage element is a logical high. In one example, the first edge of the clock signal is a rising edge, and the second edge of the clock signal is a falling edge.

Other related embodiments, implementations, implementation examples, configurations, and methods are possible which are within the scope of the subject invention.

BRIEF DESCRIPTION OF THE DRAWINGS

FIG. 3C illustrates a second predetermined edge of a clock signal.

DESCRIPTION OF THE PREFERRED EMBODIMENTS

Figure 2A:
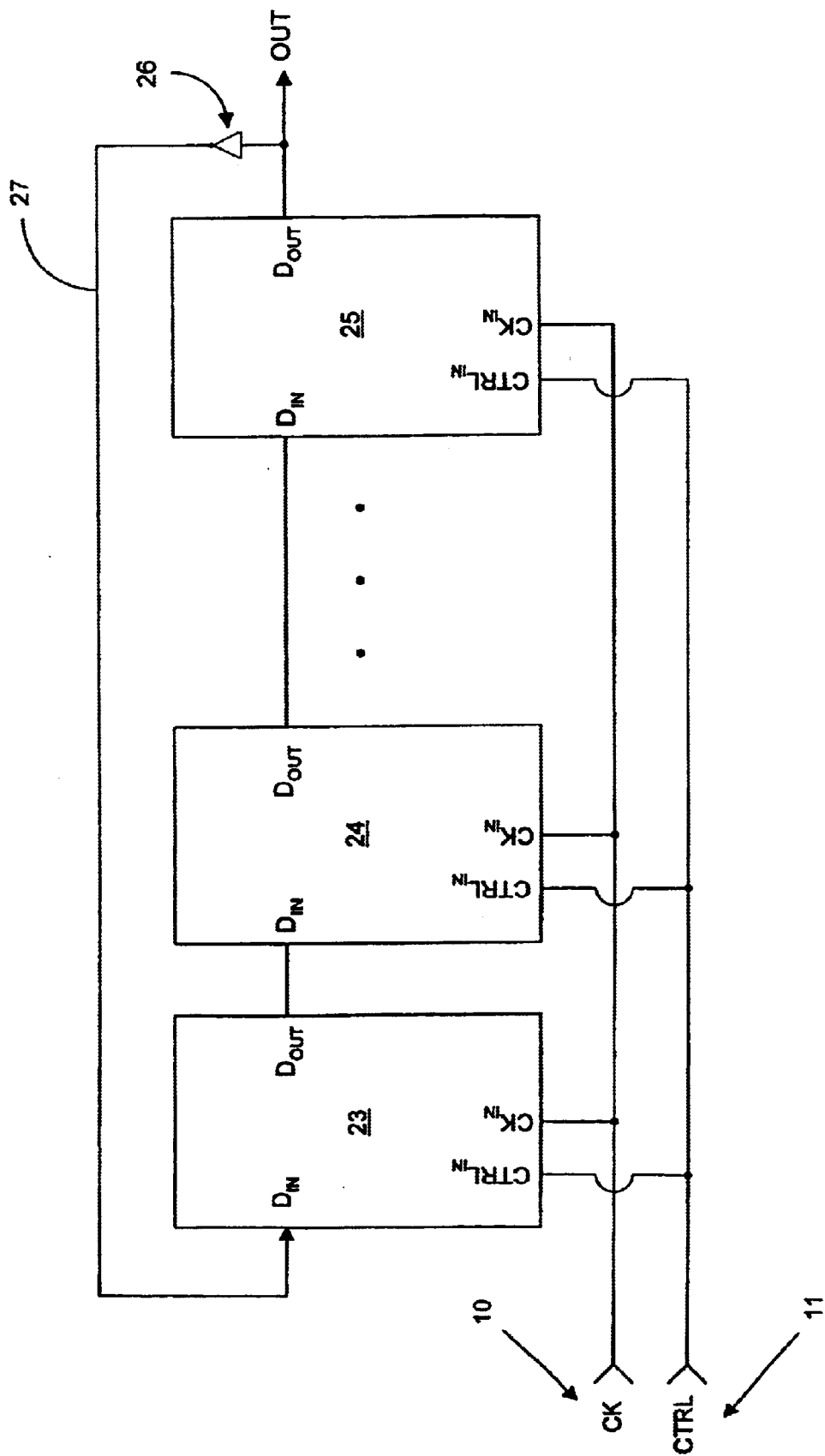
FIG. 2A illustrates a first embodiment of the subject invention.

FIG. 2A illustrates a first embodiment of the subject invention. According to this embodiment, a programmable frequency divider is provided comprising a plurality of edge triggered storage elements 23, 24, 25 arranged in sequence, each of the elements having a data input, $D_{IN}$, a data output, $D_{OUT}$, and a clock input, $CK_{IN}$, wherein a clock signal 10 is coupled to the clock inputs of each of the storage elements, the data input of the first element in the sequence is coupled to the inverse 27 of the data output of the last element in the sequence, and the data input of each of the other elements in the sequence is coupled to the data output of the preceding element in the sequence. Each storage element is configured to trigger, i.e., change state, on either a positive or negative edge of the clock signal depending on the state of a control signal 11 indicative of a characteristic of the desired division ratio and also depending on the state of the data output $D_{OUT}$ of the storage element. An inverter 26 provides to the data input of storage element 23 the inverse 27 of the data output from storage element 25. (This may also be accomplished in differential mode, as opposed to single-ended mode, by simply switching the differential lines, that is, by coupling /$D_{OUT}$ of element 25 to $D_{IN}$ of element 23).

The number of storage elements F in the sequence bears a relationship with the desired division ratio N in accordance with the following equation:

$$F = \frac{N + P}{2}$$

where P is 1 if the division ratio is odd, and 0 if the division ratio is even. Thus, for example, a division ratio of either 5 or 6 could be achieved with 3 storage elements.

The output signal OUT can be taken from the data output $D_{OUT}$ of any of the storage elements 23, 24, 25. For purposes of illustration, the output signal is taken as the data output of the last storage element 25 in the sequence.

In one implementation, each of the storage elements is configured to normally trigger on a first edge of the clock signal, either positive or negative, and to trigger on a second edge of the clock signal if the control signal is in a first predetermined state and the data output of the storage element is in a second predetermined state. In one implementation example, the first predetermined state of the control signal indicates that the division ratio is an odd integer, and the second predetermined state of the data output is a logical high or logical '1'. Thus, in this implementation example, each of the storage elements normally triggers on a first edge of the clock signal, either positive or negative, and triggers on a second edge of the clock signal if the control signal indicates an odd integer division ratio and the data output of the storage element is high.

FIG. 1C illustrates the output signal which results in this implementation in the case in which the division ratio is 3, and two storage elements are provided in a sequence. Each of the storage elements is normally configured to trigger on a rising edge of the clock signal, and to trigger on a falling edge of the clock signal when the control signal indicates that the division ratio is odd, and the data output of the storage element is a logical high. As can be seen, a 50% duty cycle output signal is provided in which one period of the output signal corresponds to three periods of the clock signal of FIG. 1A. In addition, consistent with the foregoing, the output signal transitions to a logical high upon the rising edge of the clock signal, and transitions to a logical low upon the falling edge of the clock signal. (Note that this depends upon the input, FIG. 1A, having a 50% duty cycle).

In one implementation example, each storage element 23, 24, 25 comprises an edge-triggered flip-flop coupled to a clock phase module which selectively alters the phase of the clock input to the flip-flop responsive to the state of the control signal 11 and the data output of the flip-flop in the storage element.

Figure 2B:
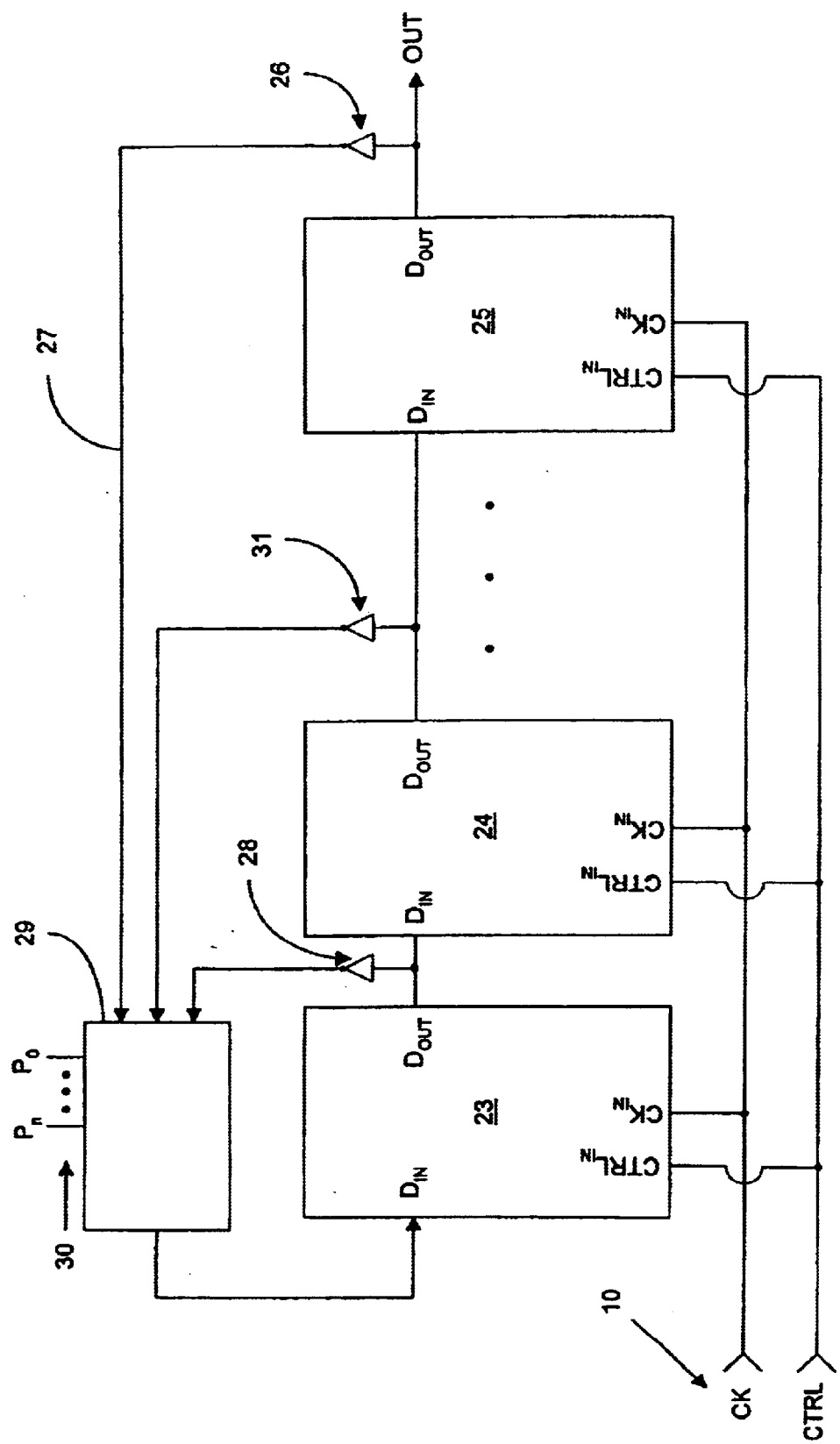
FIG. 2B illustrates a second embodiment of the subject invention.

A second embodiment of the subject invention is illustrated in FIG. 2B in which, compared to FIG. 2A, like elements are referenced with like identifying numerals. In this embodiment, the division ratio N is a programmable variable, and the number F of storage elements which contributes to the frequency division function is determined responsive to the desired division ratio. This number may be less than the number of storage elements physically present in the sequence.

The inverse of the data outputs of each of the storage elements is provided as an input to circuit 29, the output of which is coupled to the data input of the first storage element in the sequence, storage element 23. The circuit 29 selects one of these inputs responsive to the state of control inputs $P_0$–$P_n$, identified with numeral 30, and outputs the same to the data input of storage element 23. The inverse of the data outputs of storage elements 23, 24 is provided by inverters 28 and 31. (Again, in a differential mode circuit, the inverse of the data output of each storage element is available from the /$D_{OUT}$ output of each storage element). Otherwise, each of the storage elements is configured as in the first embodiment.

In one implementation, the number F of storage elements needed to perform the frequency division operation is determined by the equation:

$$F = \frac{N + P}{2}$$

where N is the desired division ratio, and P is 1 if the desired division ratio is odd, and 0 if the desired division ratio is even. A series of F storage elements is selected from a physical sequence which may have more than F storage elements. In this implementation, circuit 29 is a multiplexor. The control inputs $P_0$–$P_n$ of the multiplexor 29 are set so that the inverse of the data output of the Fth storage element in the series is provided as a data input to the first storage element in the series. Any storage elements in the sequence other than the F elements in the series are unused.

Figure 2C:
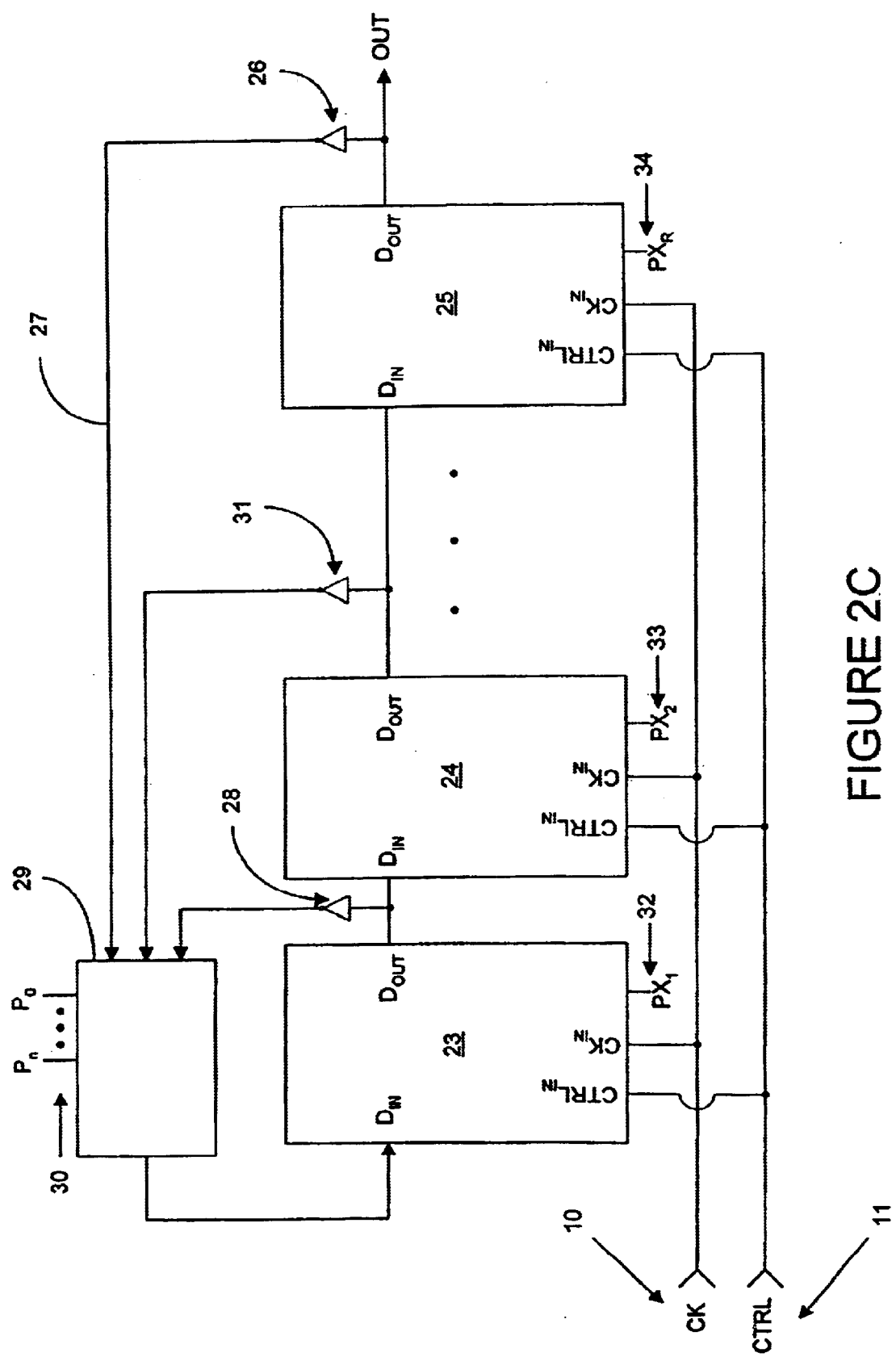
FIG. 2C illustrates a third embodiment of the subject invention.

A third embodiment of the subject invention is illustrated in FIG. 2C in which, compared to FIG. 2B, like elements are referenced with like identifying numerals. In this third embodiment, a power saving feature is provided in which unused storage elements in the sequence are placed in a power saving mode. Thus, in FIG. 2C, each of the storage elements 23, 24, and 25 are configured to turn off responsive to assertion of a control input $PX_1$, $PX_2$, $PX_R$, respectively. These control inputs are identified in FIG. 2C with the identifying numerals 32, 33, and 34. Using these signals, the storage elements other than the F storage elements needed to participate in the frequency division operation are placed in a power saving mode.

In one implementation, each of the control and clock signal inputs to a storage element are configured as current mode signals in which a logical '1' is represented through a current flow in a direction towards ground, and a logical '0' is represented by the lack of such a current flow. Each of these current mode signals is configured with a transistor which is provided along the flow path of the current mode signal to ground. All of these transistors for a given storage element are turned off if the storage element is unused for a given application.

Figure 2D:
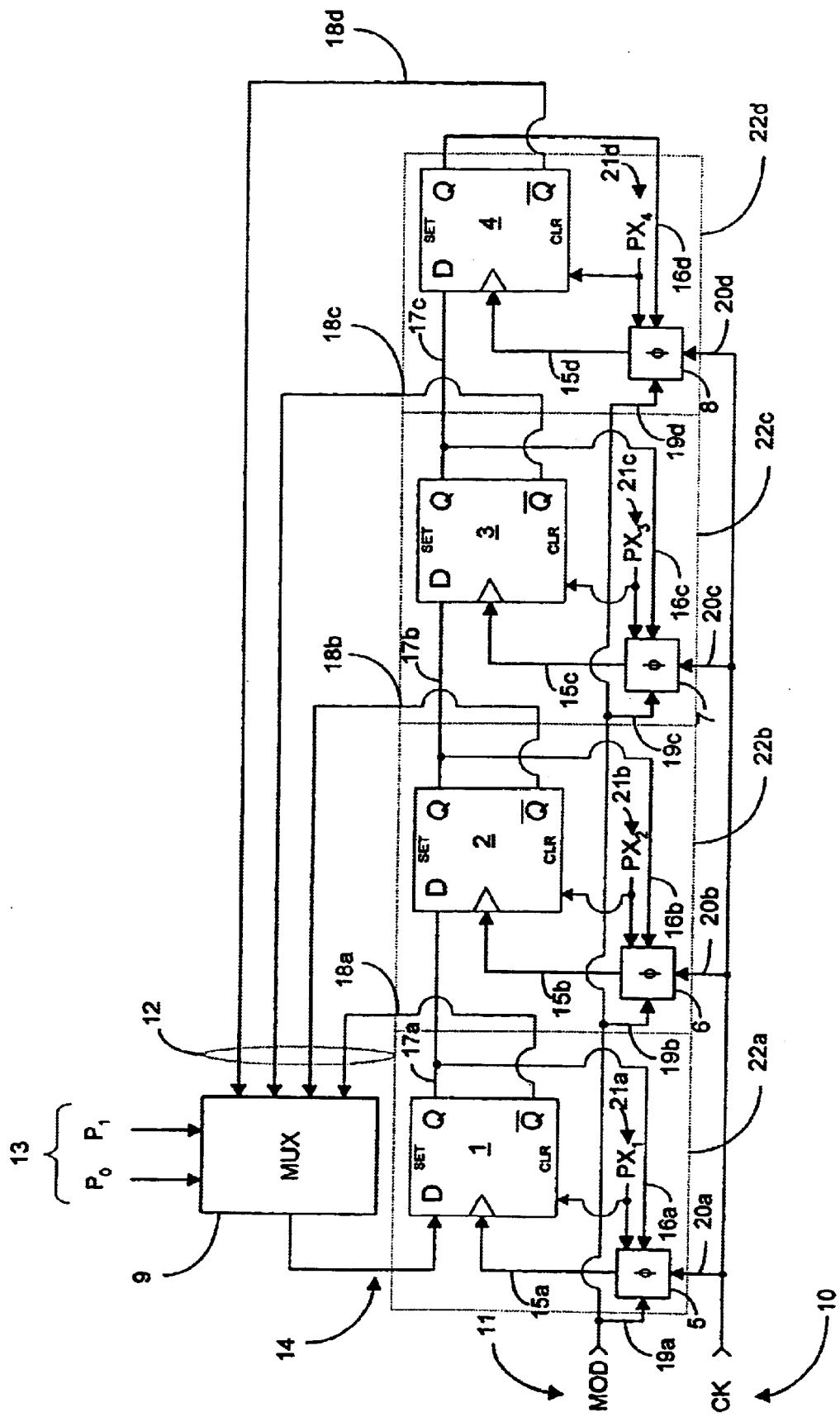
FIG. 2D illustrates an implementation of the third embodiment of the subject invention.

FIG. 2D illustrates an implementation of the third embodiment. As illustrated, in this implementation, a plurality of storage elements 22a, 22b, 22c, and 22d are provided. For purposes of illustration, four storage elements are shown, but it should be appreciated that an arbitrary number of such elements are possible. In this implementation, each storage element 22a, 22b, 22c, 22d comprises a flip-flop 1, 2, 3, 4 coupled to a clock phase module 5, 6, 7, 8 which selectively alters the phase of the clock signal to the corresponding flip-flop responsive to the state of the control signal 11 and the data output Q of the flip-flop. The clock signal 10 is provided to the clock phase modules 5, 6, 7, 8 through signal lines 20a, 20b, 20c, 20d, and the Q output of each flip-flop 1, 2, 3, 4 is provided to the clock phase modules 5, 6, 7, 8 through signal lines 16a, 16b, 16c, 16d. The selectively altered clock signal produced by the clock phase modules 5, 6, 7, 8 are provided to the clock inputs of the flip-flops 1, 2, 3, 4 through signal lines 15a, 15b, 15c, 15d.

Each flip-flop 1, 2, 3, 4 in this implementation is configured to normally trigger on a rising edge of the clock signal. Each clock phase module 5, 6, 7, 8 inverts the phase of the clock if the control signal 11 indicates that the division ratio is an odd integer, and the data output Q of the corresponding flip-flop 1, 2, 3, 4 is in a logical high state, but otherwise leaves the phase of the clock unchanged.

Each of the flip-flops 1, 2, 3, 4 also provides an output signal /Q which is in the inverse of the data output signal Q. Each of these output signals /Q is provided as a data input to multiplexor 19 through signal lines 18a, 18b, 18c, 18d. Collectively, these inputs are identified with numeral 12. Control inputs $P_0$ and $P_1$, identified with numeral 13, are also provided as inputs to multiplexor 19. The output of multiplexor 19 is coupled to the data input of flip-flop 1, the first flip-flop in the sequence, through signal line 14. Multiplexor 19 switches one of the data inputs 12 to signal line 14, and thus to the data input of flip-flop 1, responsive to the state of the control inputs 13.

Through suitable settings of the control inputs 13, the number of storage elements F which contributes to the frequency division function can be less than the number of storage elements which are physically present in the sequence. In one implementation, the number F of storage elements required to achieve a given division ratio N is calculated using the formula presented earlier:

$$F = \frac{N + P}{2}$$

where P is 1 if the division ratio is odd, and 0 if the division ratio is even. Then, a series of F elements in the physical sequence is selected, and the inverse /Q of the data output of the Fth storage element in the series is coupled to the data input of the first storage element in the series through suitable settings of the control inputs 13 to multiplexor 19.

A power saving feature is also provided in which unused storage elements, that is, those storage elements in the sequence beyond the Fth storage element, are placed in a power saving mode. This is achieved through control signals $PX_1$, $PX_2$, $PX_3$, and $PX_4$, identified in the figure with numerals 21a, 21b, 21c, and 21d. Each of these signals corresponds to a storage element which is configured to turn off responsive to assertion of the corresponding control signal. Once the required number F of flip-flops has been determined using the foregoing equation, the control signals for the unused storage elements are asserted, thus turning off these storage elements.

Figure 3A:
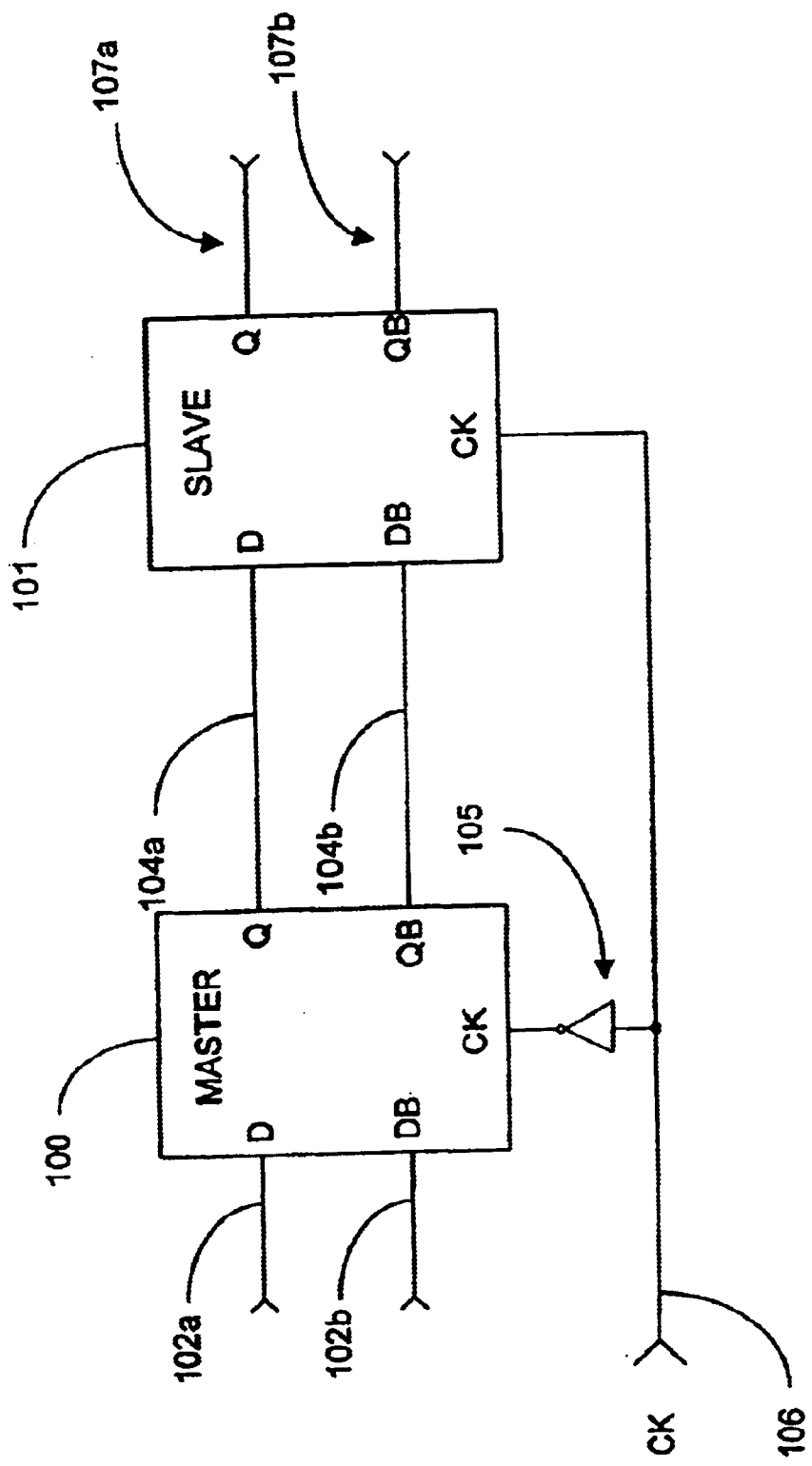
FIG. 3A illustrates an implementation of an edge-triggered flip-flop in accordance with the subject invention.

In one implementation example, each of the flip-flops 1, 2, 3, 4 is configured in a master-slave arrangement such as that depicted in FIG. 3A. As indicated, according to this arrangement, a master level-sensitive latch 100 is coupled to a slave level-sensitive latch 101. Each of the latches is configured with a differential pair of data inputs, D and DB, wherein DB is the inverse of D, and a differential pair of outputs, Q and QB, wherein QB is the inverse of Q. The differential inputs to the master latch 100 are identified with numerals 102a, 102b, and the differential outputs of the master latch are coupled to the differential inputs of slave latch 101 through signal lines 104a and 104b. The differential outputs of slave latch 101 are identified with numerals 107a and 107b. Each of the latches 100, 101 is configured with a clock input CK. A clock signal 106 is provided on signal line 106, and coupled to the clock input of master latch 100 after inversion by inverter 105, and is directly coupled to the clock input of slave latch 101. (Again, in a differential mode circuit, this inversion can be accomplished simply by flipping a differential clock signal).

Figure 3B:
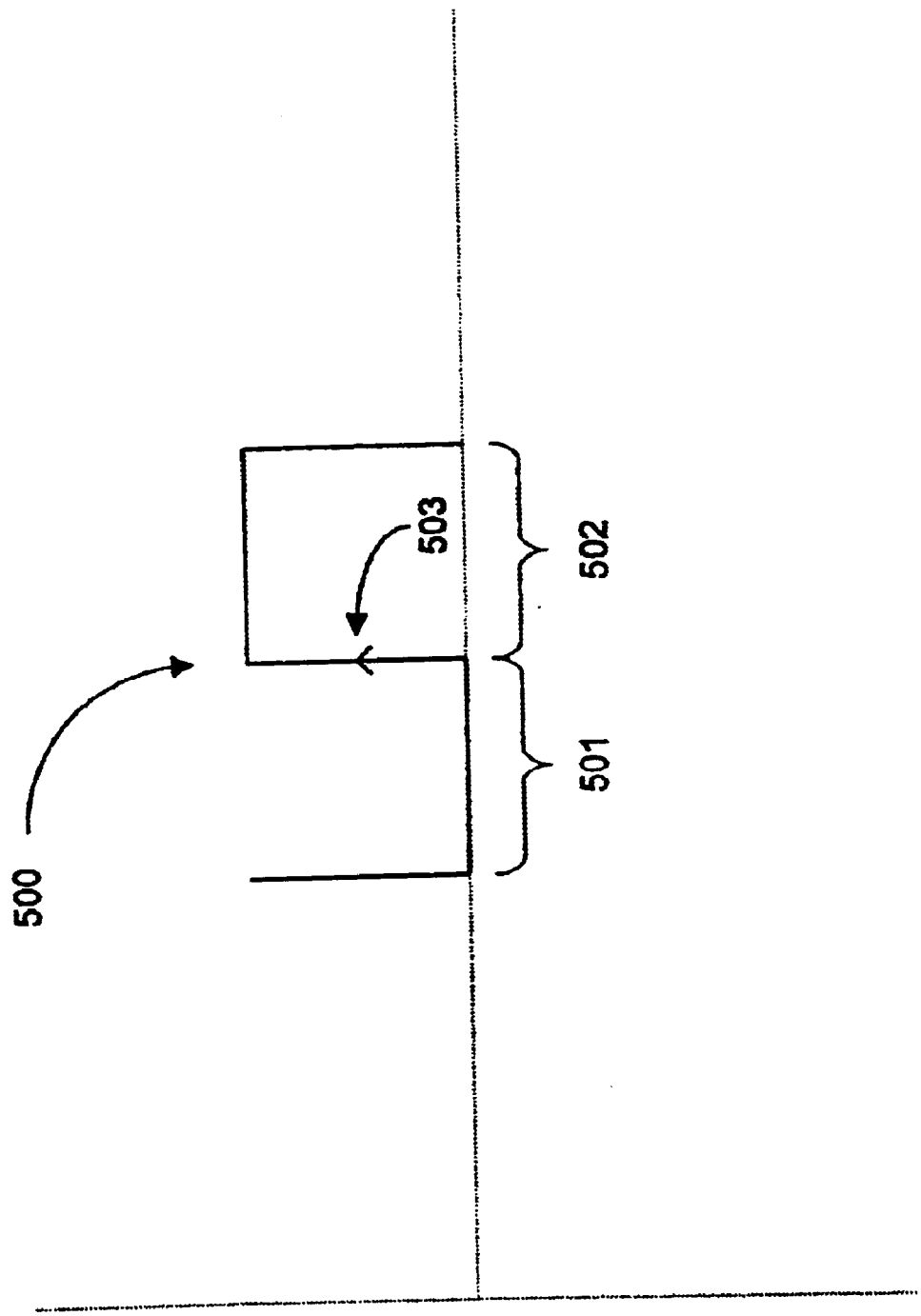
FIG. 3B illustrates a first predetermined edge of a clock signal.

Each latch is configured to latch the signals on the differential inputs thereof, D and DB, and provide the differential outputs Q and QB representative of these latched inputs when the clock input is asserted high, and to retain these differential inputs after the clock signal has returned to a logical low state. Because of the inverter 105 however, the master and slave latches perform their latching operations through non-overlapping portions of the period of the clock signal provided on signal line 106. Thus, when the clock signal on signal line 106 is low, the master latch latches the signals provided on its differential inputs 102a and 102b, and when the clock signal provided on signal line 106 is high, slave latch 101 latches the signals provided on its differential inputs. The net result is that an edge-triggered effect is achieved in which the differential inputs to the master latch 100 are provided on the slave outputs upon the rising edge of the clock signal provided on signal line 106. The situation is depicted in FIG. 3B, which shows a single period 500 of the clock signal provided on signal line 106. During period 501, the master latch latches its differential inputs, and during period 502, the slave latch latches its differential inputs. However, it is only upon the occurrence of rising edge 503 that the differential inputs of the master latch are provided as the differential outputs of the slave latch. Thus, the combination of the master and slave latches provides an edge-triggered flip-flop.

Figure 3D:
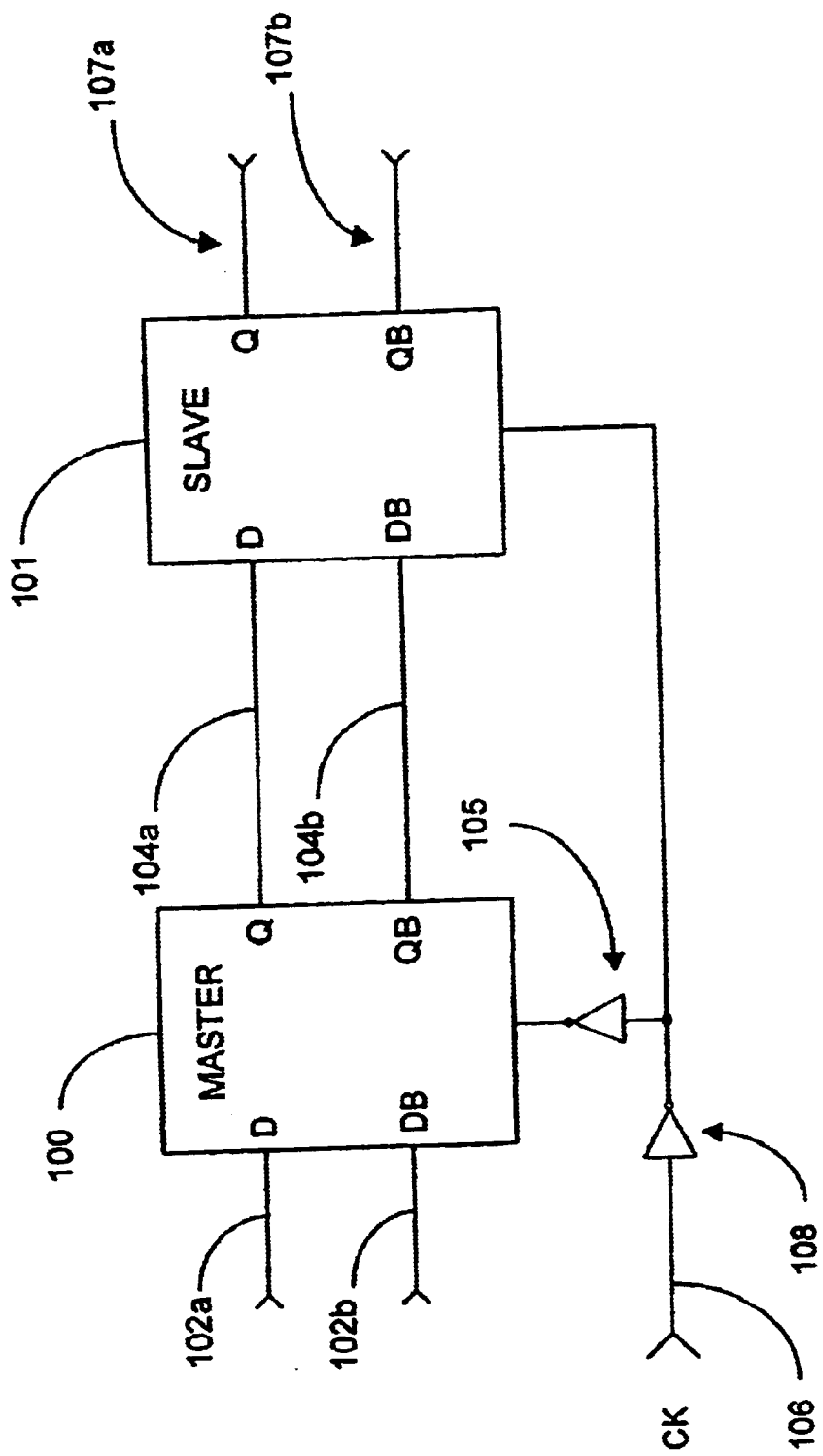
FIG. 3D illustrates a second implementation of an edge-triggered flip-flop in accordance with the subject invention.

Of course, it should be appreciated that other implementations of flip-flops 1, 2, 3, and 4 are possible. One such implementation is illustrated in FIG. 3D in which, compared to FIG. 3A, like elements are referenced with like identifying numerals. Comparing the configuration of FIG. 3D with that of FIG. 3A, it will be seen that the difference is the addition of inverter 108. Through addition of this inverter, the flip-flop represented by FIG. 3D is configured to trigger on the falling edge of the clock signal provided on signal line 106. The situation is depicted in FIG. 3C, which illustrates a single period 600 of the clock signal provided on signal line 106. During portion 601 of the period, the master latch 100 is active, and during the portion 602 of the period, slave latch 101 is active. The end result is that flip-flop represented by the two latches triggers on the falling edge 603 of the clock signal.

FIGS. 9A–9E are timing diagrams illustrating operation of one configuration of the implementation of FIG. 2D in which each flip-flop 1, 2, 3, 4 is configured to trigger on a rising edge of its clock input. In addition, in this configuration, the control signal MOD, identified with numeral 11, is a logical '1' in the case in which the division ratio is odd, and is a logical '0' if the division ratio is even. Each clock phase module 5, 6, 7, 8 is configured to leave the phase of the clock signal to the corresponding flip-flop unaltered if the MOD signal is a logical '0' or the data output Q of the corresponding flip-flop 1, 2, 3, 4 is a logical '0', but to reverse the phase of the clock signal if the MOD signal is a logical '1' and the data output Q of the corresponding flip-flop is a logical '1'.

The desired division ratio in this configuration is assumed to be 7. Thus, all four flip-flops are needed to achieve this division ratio. Accordingly, the control inputs 13 of multiplexor 9 are such that the inverse /Q of the data output of the fourth flip-flop 4 is coupled to the data input of the first flip-flop 1 in the sequence. Consistent with the foregoing, the MOD signal is a logical high, and each of the power control signals $PX_0$, $PX_1$, $PX_2$, and $PX_3$ are kept in a logical low state.

It should be appreciated, however, that other odd division ratios can easily be achieved with the circuit of FIG. 2D. For example, to achieve a division ratio of 5, only three flip-flops would be required, and the inverse of the data output of the third flip-flop in the sequence could be fed back to the data input of the first flip-flop in the sequence. The fourth flip-flop would then be unused. Similarly, to achieve a division ratio of 3, only two flip-flops would be required, and the inverse of the data output of the second flip-flop in the sequence could be fed back to the data input of the first flip-flop in the sequence. The last two flip-flops in the sequence would then be unused.

It should also be appreciated that even division ratios are also easily achieved by keeping the MOD signal low. Division ratios of 2, 4, 6, and 8 are obtained through suitable settings of the control inputs 13 to the multiplexor.

Figure 9:
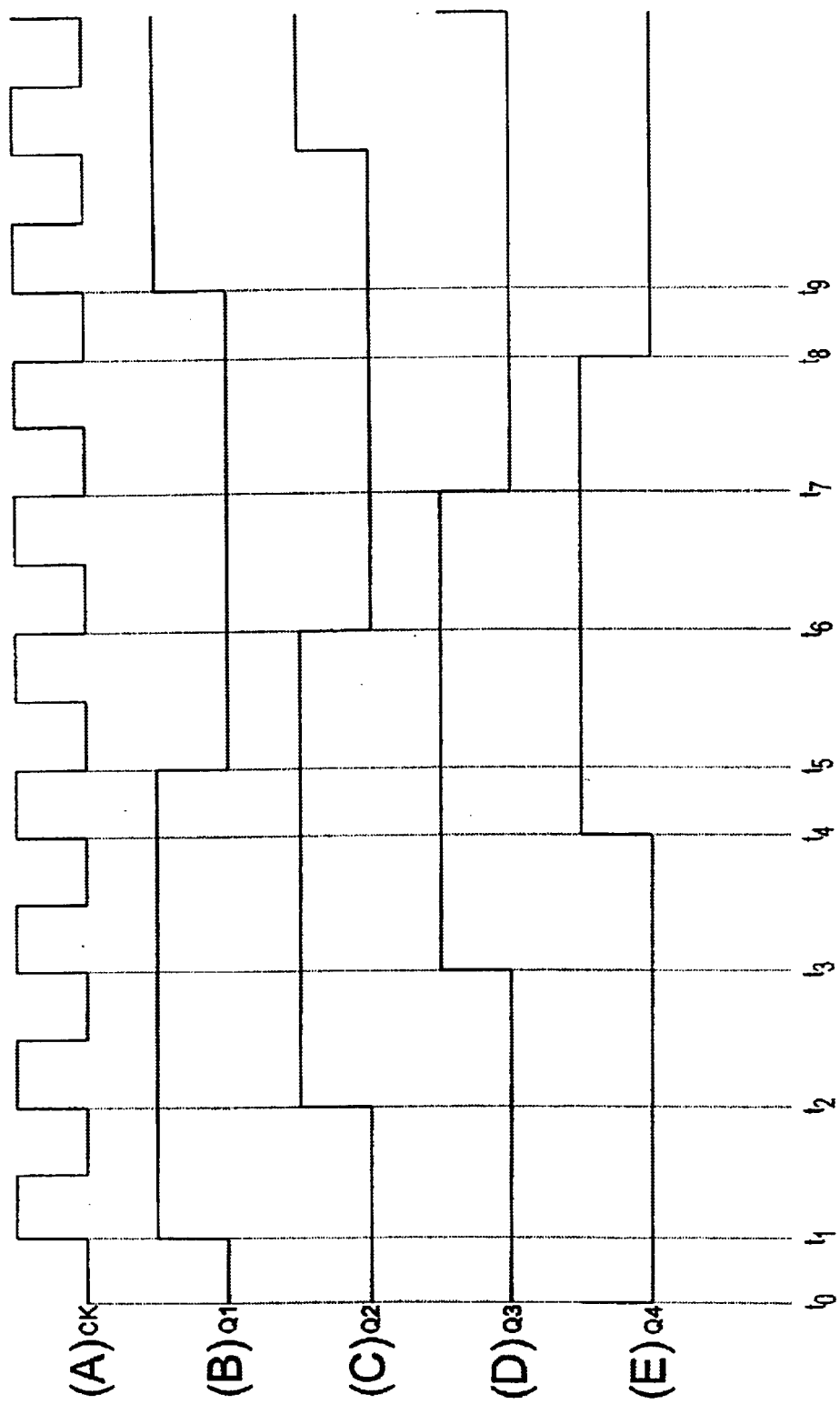
FIGS. 9A–9E are timing diagrams illustrating operation of the embodiment of FIG. 2.

FIG. 9A illustrates the clock signal 10. FIG. 9B illustrates the data output Q of the first flip-flop 1 in the sequence. FIG. 9C illustrates the data output Q of the second flip-flop 2 in the sequence. FIG. 9D illustrates the data output Q of the third flip-flop 3 in the sequence. FIG. 9E illustrates the data output Q of the fourth flip-flop 4 in the sequence. As can be seen, each of these data output signals has a period which is 7 times the period of the clock signal. Also, low-to-high transitions on a given output signal occur on a rising edge of the clock signal, and high-to-low transitions on a given output signal occur on a falling edge of the clock signal.

Moreover, transitions on a given output signal lag that of the previous flip-flop in the sequence by a single clock period, except for transitions of the output signal of the first flip-flop in the sequence, which lag that of the fourth flip-flop in the sequence by one-half of a clock period. This one-half period lag is key to the successful operation of the device in the case of an odd division ratio, and is achieved because the inverse of the data output of the last flip-flop in the sequence is fed into the data input of the first flip-flop in the sequence.

Consistent with the foregoing, the transition of signal Q2 at time $t_2$ lags the transition of Q1 at time $t_1$ by one clock period, the transition of signal Q3 at time $t_3$ lags the transition of Q2 at time $t_2$ by one clock period, the transition of Q4 at time $t_4$ lags the transition of Q3 at time $t_3$ by one clock period, the transition of Q2 at time $t_6$ lags the transition of Q1 at time $t_5$ by one clock period, the transition of Q3 at time $t_7$ lags the transition of Q2 at time $t_6$ by one clock period, and the transition of Q4 at time $t_8$ lags the transition of Q3 at time $t_7$ by one clock period.

In addition, the transition of Q1 at time $t_1$ lags the transition of Q4 at time $t_0$ by one-half a clock period, the transition of Q1 at time $t_5$ lags the transition of Q4 at time $t_4$ by one-half a clock period, and the transition of Q1 at time $t_9$ lags the transition of Q4 at time $t_8$ by one-half a clock period.

The output signal of the frequency divider can be taken to be any of the foregoing signals Q1, Q2, Q3, and Q4. As can be seen, each of these signals has a duty cycle of 50% as desired.

Figure 4:
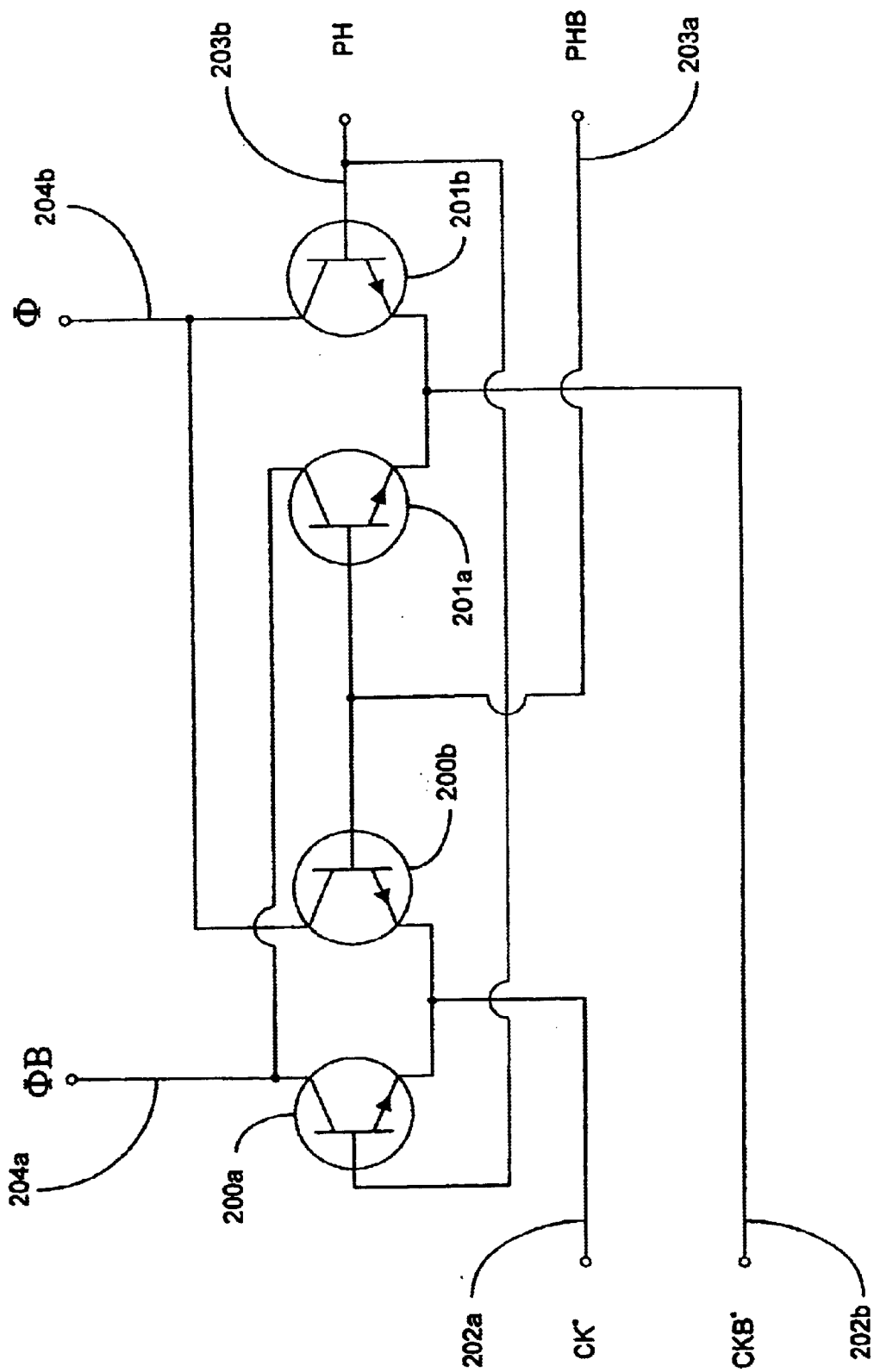
FIG. 4 illustrates an implementation of a clock phase module in accordance with the subject invention.

FIG. 4 illustrates one implementation of a clock phase module in accordance with the subject invention. Two differential pairs of NPN bipolar transistors are provided. The first pair comprises transistors 200a and 200b, and the second pair comprises transistors 201a and 201b. The emitters of transistors 200a and 200b are coupled together, as are the emitters of transistors 201a and 201b. The emitters of transistors 200a and 200b are coupled to incoming clock signal CK*, identified with numeral 202a, and the emitters of transistors 201a and 201b are coupled to incoming clock signal CKB*, identified with numeral 202b. The clock signals CK* and CKB* bear a complementary relationship to one another such that CKB* is the inverse of CK*. The bases of transistors 200a and 201b are coupled together and to the incoming signal PH, which is provided over signal line 203b. In addition, the bases of transistors 200b and 201a are coupled together and to the incoming signal PHB, which is provided over signal line 203a. The incoming signals PH and PHB bear a complementary relationship to one another, such that PHB is the inverse of PH.

The collectors of transistors 200a and 201a are coupled together, and an output signal ΦB is obtained from the node formed by the union of these two collectors. The output signal ΦB is provided over signal line 204a.

The collectors of transistors 200b and 201b are also coupled together, and an output signal Φ is obtained from the node formed from the union of these two collectors. The output signal Φ is provided over signal line 204b. The output signals Φ and ΦB bear a complementary relationship to one another such that ΦB is the inverse of Φ.

In the implementation shown in FIG. 4, the clock signals CK*, CKB* are current mode signals in which a logical high is represented by a current flow towards ground (towards the bottom of the page in FIG. 4), and in which a logical low is represented by the lack of such a current flow. The signals PH and PHB are voltage mode signals in which a logical high is represented by a voltage which is above the base-emitter voltage of an NPN bipolar transistor of the type used for transistors 200a, 200b, 201a, 201b, and which typically is close to or at $V_{CC}$, and a logical low is represented by a voltage which is below the base-emitter voltage of an NPN transistor, and which is close to or at 0 volts. In addition, in this implementation, the signals Φ and ΦB are current mode signals.

The clock signals CK, CKB* represent a differential pair of input clock signals, and the signals PH and PHB represent a differential pair of phase control signals, and Φ and ΦB represent a differential pair of output clock signals. The signals PH and PHB determine whether there will be a phase reversal between the incoming clock signals CK*, CKB* and the outgoing clock signals Φ and ΦB. In the case in which PH is low, and PHB high, there is no phase reversal, and input clock signals CK*, CKB* are passed through the circuit with their phase unchanged. More specifically, in this case, input clock signal CK* is passed through transistor 200b (which is turned on because PHB is high) to signal line 204b to form output signal Φ, and input signal CKB* is passed through transistor 201a (which is turned on because PHB is high) to signal line 204a to form output signal ΦB. Conversely, in the case in which PH is high, and PHB low, there is a phase reversal between input clock signals CK* and CKB* and outgoing clock signals Φ and ΦB. More specifically, input clock signal CK* is passed through transistor 200a (which is on because PH is high) to signal line 204a to form output clock signal ΦB, and input clock signal CKB* is passed through transistor 201b (which is turned on because PH is high) to signal line 204b to form output clock signal Φ in the case in which PH is high.

In one configuration, the signals PH and PHB are determined responsive to whether the desired division ratio is odd or even, and whether the data output of the corresponding storage element is high or low. More specifically, in this configuration, the signal PH is low (and PHB high) when the desired division ratio is even or when the data output of the corresponding storage element is high, and the signal PH is high (and PHB low) when the desired division ratio is odd and the data output of the corresponding storage element is high.

Figure 5:
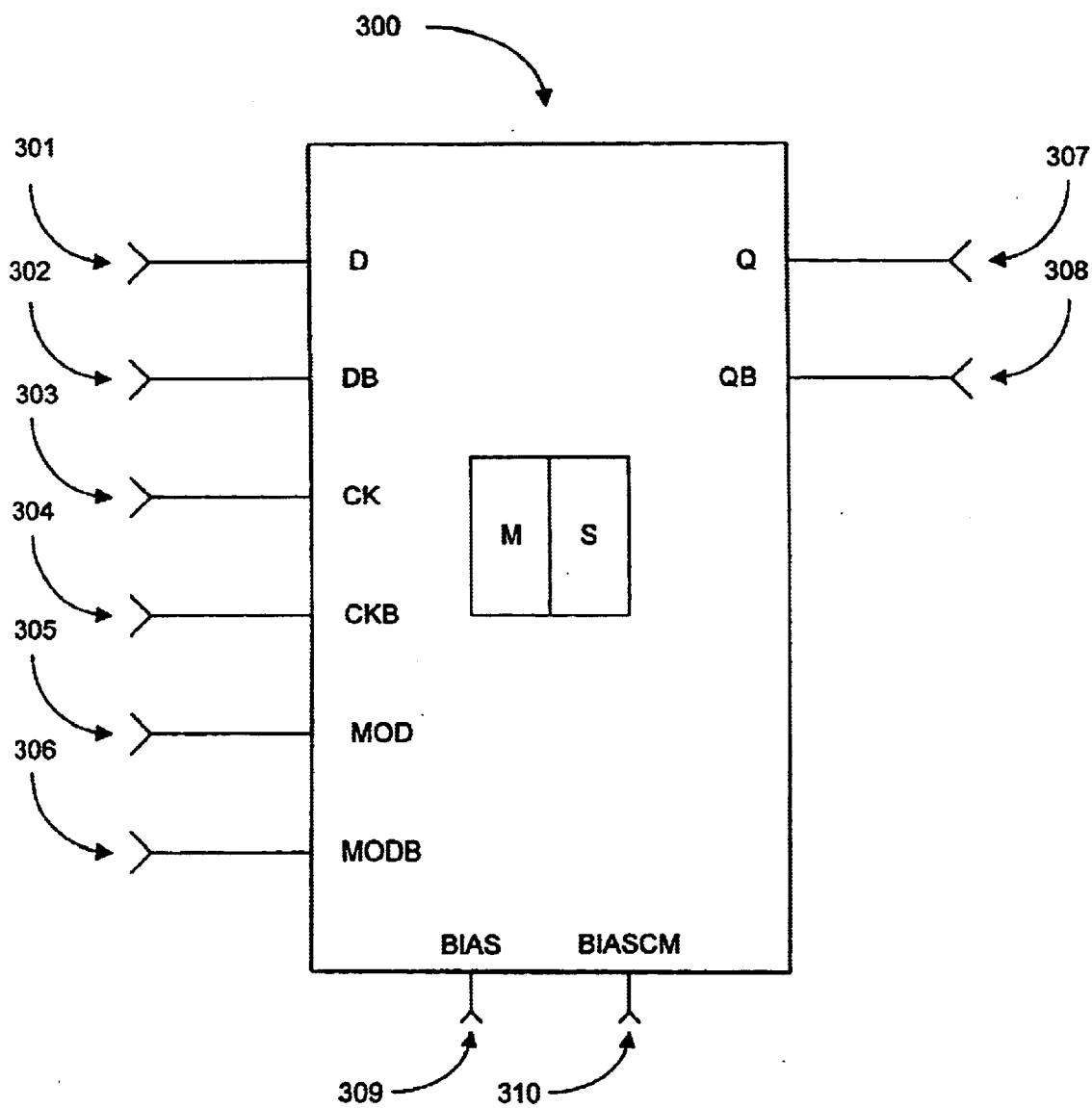
FIG. 5 illustrates an implementation of a storage element comprising an integrated master-slave flip-flop and clock phase module in accordance with the subject invention.

FIG. 5 depicts an implementation of the subject invention in which a clock phase module and a master-slave edge-triggered flip-flip are integrated on a single IC to form storage element 300. As illustrated, the inputs to storage element 300 comprise 1.) a differential pair of data inputs, D and DB, which bear a complimentary relationship to one another, and which are identified respectively with numerals 301 and 302; 2.) a differential pair of clock inputs, CK and CKB, which bear a complementary relationship to one another, and which are identified respectively with numerals 303 and 304; 3.) a differential pair of control signals, MOD and MODB, which bear a complementary relationship to one another; 4.) power control signals BIAS and BIASCM, which are identified respectively with numerals 309 and 310; and 5.) a differential pair of output signals, Q and QB, which are identified respectively with numerals 307 and 308.

This circuit functions as follows. When the signals BIAS and BIASCM are low, the circuit is turned off, and is not operational. When these signals are high, the circuit is operational.

When the circuit is turned on, in the case in which MOD is low (and MODB is high), indicating an even division ratio, or in the case in which the data output Q is low, the data inputs D and DB will be provided to the outputs Q and QB respectively upon the rising edge of CK (and the falling edge of CKB). Again assuming the circuit is turned on, in the case in which MOD is high (and MODB low), indicating an odd division ratio, the data inputs D and DB will be provided to the outputs Q and QB respectively upon the falling edge of CK (and the rising edge of CKB).

Figure 6:
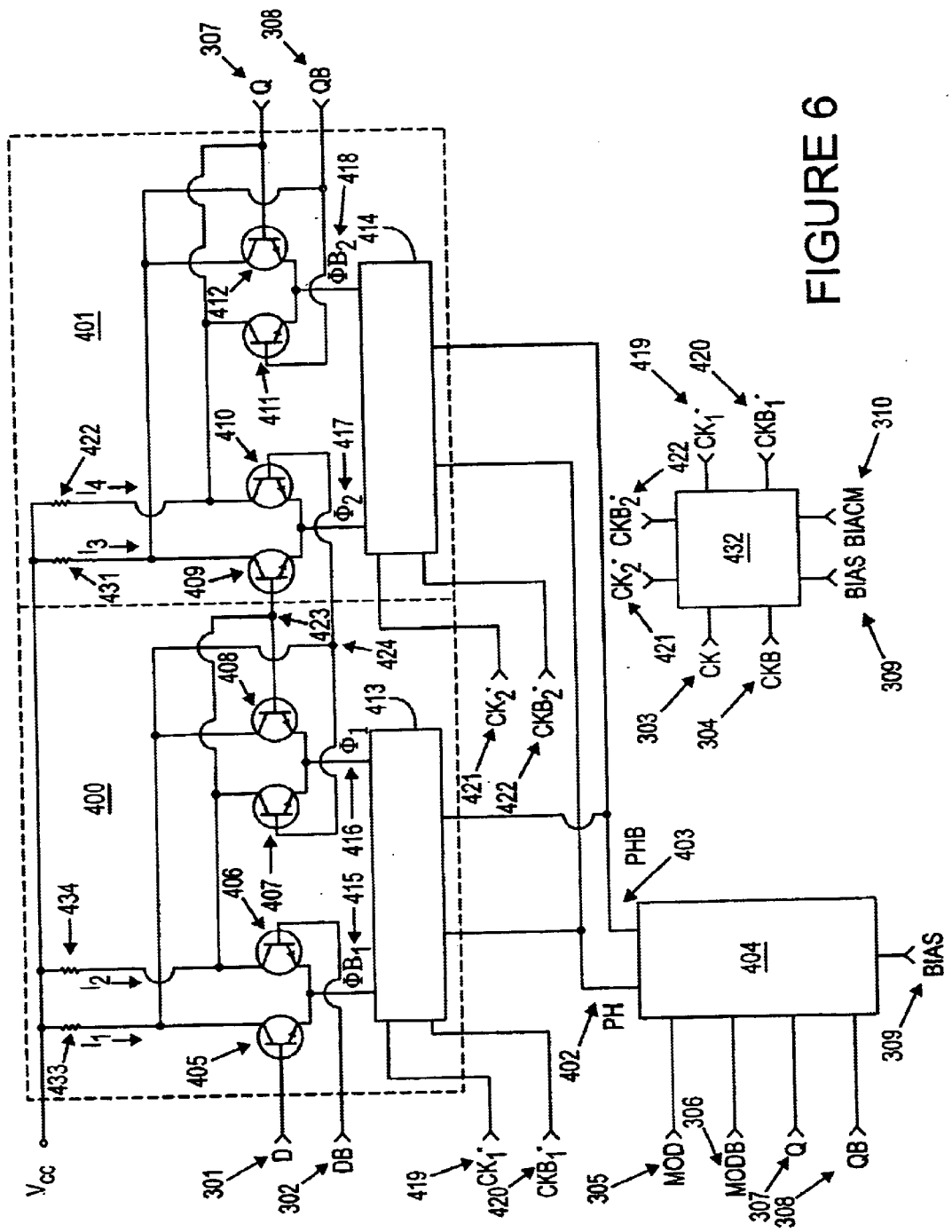
FIGS. 6–8 illustrate an example implementation of the storage element of FIG. 5.

FIG. 6 illustrates an implementation of the storage element of FIG. 5, in which, compared to FIG. 5, like elements are referenced with like identifying numerals. A master portion 400, and a slave portion 401 are provided. The master portion 400 comprises a first differential pair of NPN bipolar transistors, identified with numerals 405 and 406, and a second differential pair of NPN bipolar transistors, identified with numerals 407 and 408. Also included is a clock phase module 413 of the type illustrated in FIG. 4 and discussed previously.

The emitters of transistors 405 and 406 are coupled together and provided with a signal, $\Phi B_1$ provided over signal line 415 from clock phase module 413. The signal $\Phi B_1$ is a particular rendition of the signal $\Phi B$ discussed previously in relation to the clock phase module of FIG. 5. The collector of transistor 405 is coupled to $V_{CC}$ through resistor 433, and the collector of transistor 406 is coupled to $V_{CC}$ through resistor 434. The data input signal D, identified with numeral 301, is provided to the base of transistor 405, and the data input signal DB, identified with numeral 302, is provided to the base of transistor 406.

The emitters of transistors 407 and 408 are coupled together and provided with the input signal $\Phi_1$ over signal line 416 from clock phase module 413. The signal $\Phi_1$ is a particular rendition of the signal $\Phi$ discussed earlier in relation to the clock phase module of FIG. 4. The collector of transistor 407 is coupled to that of transistor 406, and to the bases of transistors 408 and 409. The collector of transistor 408 is coupled to that of transistor 405, and to the bases of transistors 407 and 410.

The clock phase module 413 receives as inputs the differential pair of inputs $CK_1^*$, $CKB_1^*$, identified respectively with numerals 419 and 420. These signals are particular renditions of the signals $CK^*$, $CKB^*$ discussed earlier in relation to the clock phase module of FIG. 4. Clock phase module 413 also receives as inputs the signals PH and PHB, identified respectively with numerals 402 and 403. These are particular renditions of the signals PH and PHB discussed earlier in relation to the clock phase module of FIG. 4.

The slave portion 401 comprises a first differential pair of NPN bipolar transistors, identified with numerals 409 and 410, and a second differential pair of NPN bipolar transistors, identified with numerals 411 and 412. Also included is a clock phase module 414 of the type illustrated in FIG. 4 and discussed previously.

The emitters of transistors 409 and 410 are coupled together and provided with a signal, $\Phi_2$, provided over signal line 417 from clock phase module 414. The signal $\Phi_2$ is a particular rendition of the signal $\Phi$ discussed previously in relation to the clock phase module of FIG. 5. The collector of transistor 409 is coupled to $V_{CC}$ through resistor 431, and the collector of transistor 410 is coupled to $V_{CC}$ through resistor 422. As discussed previously, the collector of transistors 406 and 407 are coupled to the base of transistor 409 (as well as the base of transistor 408). Also as discussed previously, the base of transistor 410 is coupled to the collectors of transistors 405 and 408 (as well as the base of transistor 407).

The emitters of transistors 411 and 412 are coupled together and provided with the input signal $\Phi B_2$ over signal line 418 from clock phase module 414. The signal $\Phi B_2$ is a particular rendition of the signal $\Phi B$ discussed earlier in relation to the clock phase module of FIG. 4. The collector of transistor 411 is coupled to that of transistor 410, and to the base of transistor 412. The collector of transistor 412 is coupled to that of transistor 409, and to the base of transistor 411. Output signal Q, identified with numeral 307, extends from the base of transistor 412, and output signal QB, identified with numeral 308, extends from the base of transistor 411.

The clock phase module 414 receives as inputs the differential pair of inputs $CK_2^*$, $CKB_2^*$, identified respectively with numerals 421 and 422. These signals are particular renditions of the signals $CK^*$, $CKB^*$ discussed earlier in relation to the clock phase module of FIG. 4. Clock phase module 414 also receives as inputs the signals PH and PHB, identified respectively with numerals 402 and 403. These are particular renditions of the signals PH and PHB discussed earlier in relation to the clock phase module of FIG. 4.

Module 404 receives as inputs the signals MOD and MODB, identified respectively with numerals 305 and 306. These are the same signals discussed earlier in relation to the storage element of FIG. 5. Module 404 also receives as inputs the signals Q and QB, identified respectively with numerals 307 and 308. These are the same signals described earlier as extending respectively from the bases of transistors 412 and 411. Another input to module 404 is the signal BIAS, identified with numeral 309. When BIAS is asserted high, module 404 is turned on, and when it is kept low, module 404 is turned off.

The purpose of module 404 is to produce the signals PH and PHB responsive to the signals MOD, MODB, Q, and QB. In one configuration, signal PH is asserted high (and PHB kept low) when it is desired to reverse the phase of the clock signals $CK_1^*$, $CKB_1^*$ before passage of the same to master portion 400 in the form of signals $\Phi_1$ and $\Phi B_1$ respectively, and also when it is desired to reverse the phase of the clock signals $CK_2^*$, $CKB_2^*$ before passage of the same to slave portion 401 in the form of signals $\Phi_2$ and $\Phi B_2$, respectively. In this configuration, signal PH is kept low (and PHB asserted high) when it is desired to keep the phase of the foregoing clock signals unaltered.

In the configuration depicted in FIG. 6, the module 404 is configured to assert PH high (and keep PHB low) in the case in which MOD is high (and MODB is low), indicating that the desired division ratio is odd, and the data signal Q is high (and QB low). Conversely, module 404 is configured to keep PH low (and assert PHB high) in the case in which MOD is low (and MODB high), indicating an even division ratio, or the case in which Q is low (and QB high).

Module 432 receives as inputs the differential pair of clock input signals CK and CKB, identified respectively with numerals 303 and 304, and the BIAS and BIASCM signals, identified respectively with numerals 309 and 310. When either of the BIAS and BIASCM signals are low, module 432 is turned off, and when both these signals are high, the module is turned on.

In the configuration depicted in FIG. 6, the signals CK and CKB are voltage mode signals, and module 432 functions to produce two current mode renditions of the signals CK and CKB. The first rendition is the signals $CK_1^*$ and $CKB_1^*$, identified with numerals 419 and 420 respectively, and the second rendition is the signals $CK_2^*$ and $CKB_2^*$, identified with numerals 421 and 422 respectively. Since these signals are renditions of the same underlying signal, they will be in phase. The signals $CK_1^*$, $CKB_1^*$ are provided as inputs to clock phase module 413, and the signals $CK_2^*$, $CKB_2^*$ are provided as inputs to clock phase module 414.

Figure 10:
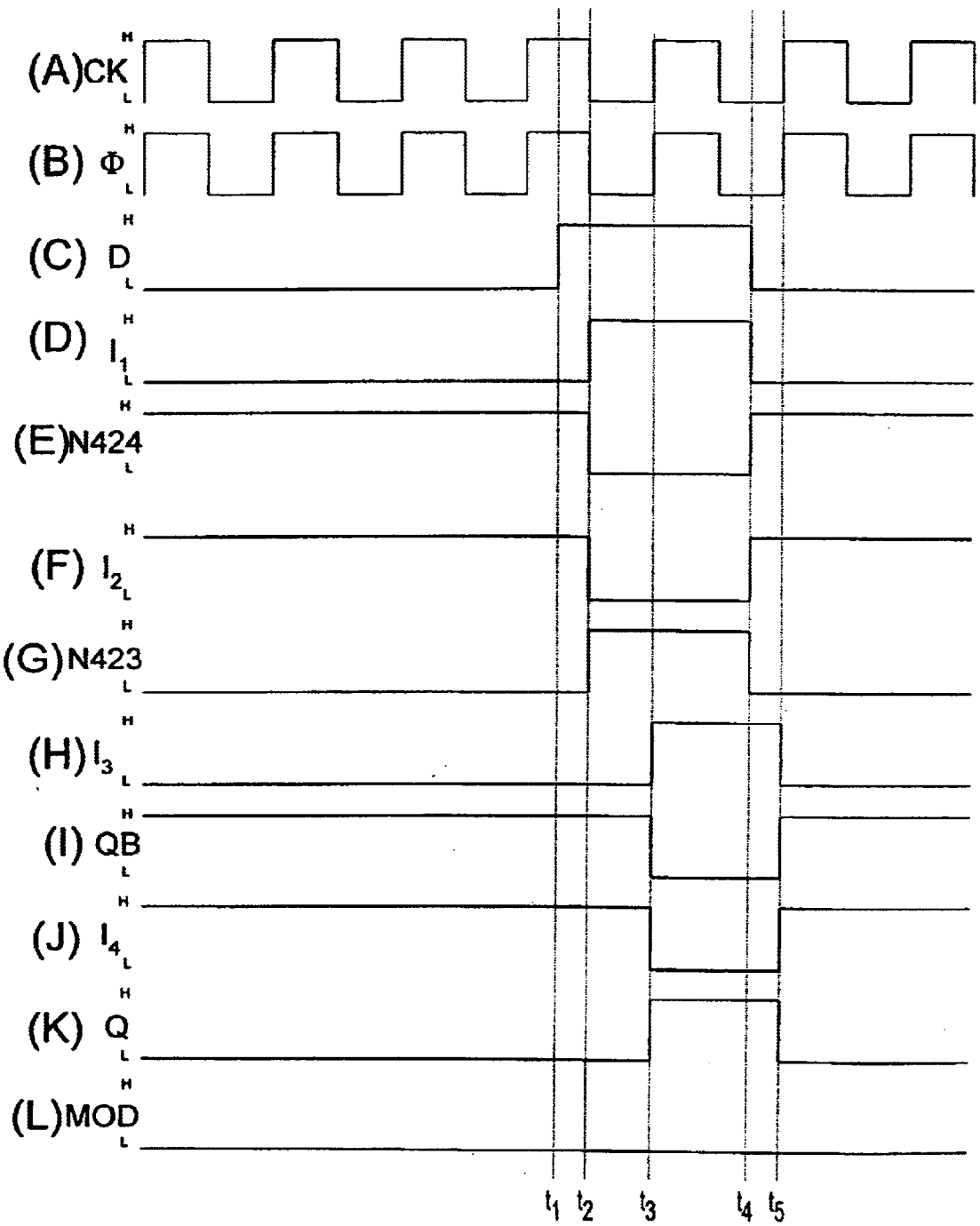
FIGS. 10A–10L and 11A–11L are timing diagrams illustrating operation of the example implementation of FIGS. 6–8.

The operation of the storage element of FIG. 6 in the case in which the MOD signal is low (indicating an even division ratio) can be explained with reference to FIGS. 10A–10L, which are timing diagrams of several of the signals identified in FIG. 6. FIG. 10L illustrates the MOD signal in the low state. FIG. 10A illustrates the clock signal CK, identified with numeral 303 in FIG. 6. FIG. 10B illustrates both of the $\Phi_1$ or $\Phi_2$ signals, identified in FIG. 6 with numerals 416 and 417 respectively. As can be seen, since the MOD signal is low, the phase of both of these signals coincides with that of the CK signal, and there is no phase inversion.

An example scenario for the D input 301 is illustrated in FIG. 10C, that for the Q output 307 is illustrated in FIG. 10K, and that for the QB output 308 is illustrated in FIG. 10I. As illustrated, the D input 301 starts out in the low state, the Q output 307 also starts out in the low state, and the QB output 308 starts out in the high state.

It will be recalled that the signals $\Phi_1$ and $\Phi B_1$ are complementary signals, as are $\Phi_2$ and $\Phi B_2$. Moreover, all are current mode signals. Hence, when one of these signals is asserted high, a current flows downward towards ground, and when one is in a low state, there is an absence of such a current. Furthermore, $\Phi_1$ is in phase with $\Phi_2$, and $\Phi B_1$ is in phase with $\Phi B_2$.

When $\Phi B_1$ and $\Phi B_2$ go high, $\Phi_1$ and $\Phi_2$ go low. Hence, transistors 405 and 406, and 411 and 412, will be placed in an enabled state, and transistors 407 and 408, and 409 and 410, will be placed in a disabled state. Moreover, since the D input 301 is low, and the DB input 302 is high, transistor 406 will conduct, while transistor 405 becomes effectively an open circuit. Furthermore, since the Q output 307 is low, and the QB output 308 is high, transistor 411 will conduct, and transistor 412 becomes effectively an open circuit.

Consequently, current $I_1$ will be blocked, that is, as indicated in FIG. 10D, be a logical low, while current $I_2$ will flow, that is, be a logical high as indicated in FIG. 10F. Similarly, as indicated in FIG. 10H, current $I_3$ will be blocked, i.e., a logical low, and, as indicated in FIG. 10J, current $I_4$ will flow, i.e., be a logical high. As indicated in FIG. 10G, resistor 434 is such that the voltage drop across it is sufficient to drive node 423 to the low state. Similarly, resistor 422 is such that the voltage drop across it is sufficient to ensure that output signal 307 remains in the low state. Because of the lack of flow of $I_1$, as indicated in FIG. 10E, node 424 is placed in a high state, and because of the lack of flow of $I_3$, the output signal 308 is maintained in a high state.

When $\Phi_1$ and $\Phi_2$ go high, and $4B_1$ and $\Phi B_2$ go low, transistors 405 and 406, and 411 and 412, are placed in a disabled state, and transistors 407 and 408, and 409 and 410, are placed in an enabled state. Since node 424 is in a high state and node 423 in a low state, transistor 407 will conduct, and transistor 408 will become effectively an open circuit. Similarly, transistor 410 will conduct, and transistor 409 will effectively become an open circuit. Consequently, $I_1$ will continue to be blocked, i.e., stay in the low state, $I_2$ will continue to flow, i.e., stay in the high state, albeit through transistor 407 rather than transistor 406, $I_3$ will continue to be blocked, i.e., stay in the low state, and $I_4$ will continue to flow, i.e., stay in the high state, albeit through transistor 410 rather than transistor 412. As a result, the state of all the foregoing signals will remain the same as when $\Phi B_1$ and $\Phi B_2$ were asserted.

The status quo is maintained until time $t_1$, at which time, as indicated in to FIG. 10C, the input signal 301 undergoes a low-to-high transition. At the time this occurs, $\Phi B_1$ is low, so there is no immediate effect as transistor 405 is disabled. However, at time $t_2$, $\Phi B_1$ goes high, and transistor 405 begins to conduct. At the same time, transistor 406 is turned off (because DB is low), as are transistors 407 and 408 (because $\Phi_1$ is low). Consequently, as indicated in FIG. 10F, $I_2$ goes low, and, as indicated in FIG. 10D, $I_1$ goes high. As indicated in FIG. 10E, resistor 433 is such that the voltage drop across it is sufficient to drive node 424 to a low state. In addition, because $I_2$ is blocked, as indicated in FIG. 10G, node 423 rises to the high state. This state of affairs lasts until time t3, when the signals $\Phi_1$ and $\Phi_2$ undergo a low-to-high transition.

At this time, transistors 409 and 410 are enabled, and transistors 411 and 412 are disabled. Since node 423 is in the high state, transistor 409 begins conducting, and, as indicated in FIG. 10H, $I_3$ goes high. In addition, since node 424 is low, transistor 410 is effectively an open circuit, and, as indicated in FIG. 10J, current $I_4$ goes low. As indicated in FIG. 10I, resistor 431 is such that the voltage drop across it is sufficient to drive output signal 308 into a low state. In addition, because of the blockage of $I_4$, as indicated in FIG. 10K, output signal 307 rises to the high level.

Meanwhile, as $\Phi B_1$ goes low, transistors 405 and 406 are disabled, and transistors 407 and 408 are enabled. Since node 423 goes high, transistor 408 conducts, and $I_1$ continues to flow to ground through transistor 408. However, node 424 is low, and thus transistor 407 is effectively an open circuit. Consequently, $I_2$ continues to stay blocked.

This state of affairs remains until time $t_4$, when the data input signal 301 undergoes a high-to-low transition. At that time, since the $\Phi B_1$ and $\Phi B_2$ signals are high, transistor 406 begins conducting, and, as indicated in FIG. 10F, $I_2$ goes high. Similarly, transistor 405 turns off, and, as indicated in FIG. 10D, $I_1$ goes low. As indicated in FIGS. 10E and 10G respectively, node 424 goes high, and node 423 goes low.

At time $t_5$, when $\Phi_1$ and $\Phi_2$ go high, transistor 410 begins conducting, and, as indicated in FIG. 10J, $I_4$ goes high. Similarly, at that time, transistor 409 is turned off, and, as indicated by FIG. 10H, $I_3$ goes low. As indicated in FIG. 10K, when $I_4$ goes high, the output signal Q is driven to a low state. Similarly, as indicated in FIG. 10I, when $I_3$ goes low, the output signal QB rises to the high state.

From the foregoing, it can be seen that, in the case in which MOD is low, for both low-to-high and high-to-low transitions, the output signal Q transitions on the rising edge of CK.

The operation of the storage element of FIG. 6 in the case in which the MOD signal is high (indicating an odd division ratio) can be explained with reference to FIG. 11A–11L, which are timing diagrams of several of the signals identified in FIG. 6. FIG. 11L illustrates the MOD signal in the high state. FIG. 11A illustrates the clock signal CK, identified with numeral 303 in FIG. 6. FIG. 11B illustrates both of the $\Phi_1$ or $\Phi_2$ signals, identified in FIG. 6 with numerals 416 and 417 respectively. As can be seen, since the MOD signal is high, the phase of both of these signals is reversed in relation to that of the CK signal when the Q data output signal is high, and is the same as that of the CK signals when the Q data output signal is low.

An example scenario for the D input 301 is illustrated in FIG. 11C, that for the Q output 307 is illustrated in FIG. 11K, and that for the QB output 308 is illustrated in FIG. 11I. As illustrated, the D input 301 starts out in the low state, the Q output 307 also starts out in the low state, and the QB output 308 starts out in the high state.

When $\Phi B_1$ and $\Phi B_2$ go high, $\Phi_1$ and $\Phi_2$ go low. Hence, transistors 405 and 406, and 411 and 412, will be placed in an enabled state, and transistors 407 and 408, and 409 and 410, will be placed in a disabled state. Moreover, since the D input 301 is low, and the DB input 302 is high, transistor 406 will conduct, while transistor 405 becomes effectively an open circuit. Furthermore, since the Q output 307 is low, and the QB output 308 is high, transistor 411 will conduct, and transistor 412 becomes effectively an open circuit.

Consequently, current $I_1$ will be blocked, that is, as indicated in FIG. 11D, be a logical low, while current $I_2$ will flow, that is, be a logical high as indicated in FIG. 11F. Similarly, as indicated in FIG. 11H, current $I_3$ will be blocked, i.e., a logical low, and, as indicated in FIG. 11J, current $I_4$ will flow, i.e., be a logical high. As indicated in FIG. 11G, resistor 434 is such that the voltage drop across it is sufficient to drive node 423 to the low state. Similarly, resistor 422 is such that the voltage drop across it is sufficient to ensure that output signal 307 remains in the low state. Because of the lack of flow of $I_1$, as indicated in FIG. 11E, node 424 is placed in a high state, and because of the lack of flow of $I_3$, the output signal 308 is maintained in a high state.

When $\Phi_1$ and $\Phi_2$ go high, and $\Phi B_1$ and $DB_2$ go low, transistors 405 and 406, and 411 and 412, are placed in a disabled state, and transistors 407 and 408, and 409 and 410, are placed in an enabled state. Since node 424 is in a high state and node 423 in a low state, transistor 407 will conduct, and transistor 408 will become effectively an open circuit. Similarly, transistor 410 will conduct, and transistor 409 will effectively become an open circuit. Consequently, $I_1$ will continue to be blocked, i.e., stay in the low state, $I_2$ will continue to flow, i.e., stay in the high state, albeit through transistor 407 rather than transistor 406, $I_3$ will continue to be blocked, i.e., stay in the low state, and $I_4$ will continue to flow, i.e., stay in the high state, albeit through transistor 410 rather than transistor 412. As a result, the state of all the foregoing signals will remain the same as when $\Phi B_1$ and $\Phi B_2$ were asserted.

Figure 1:
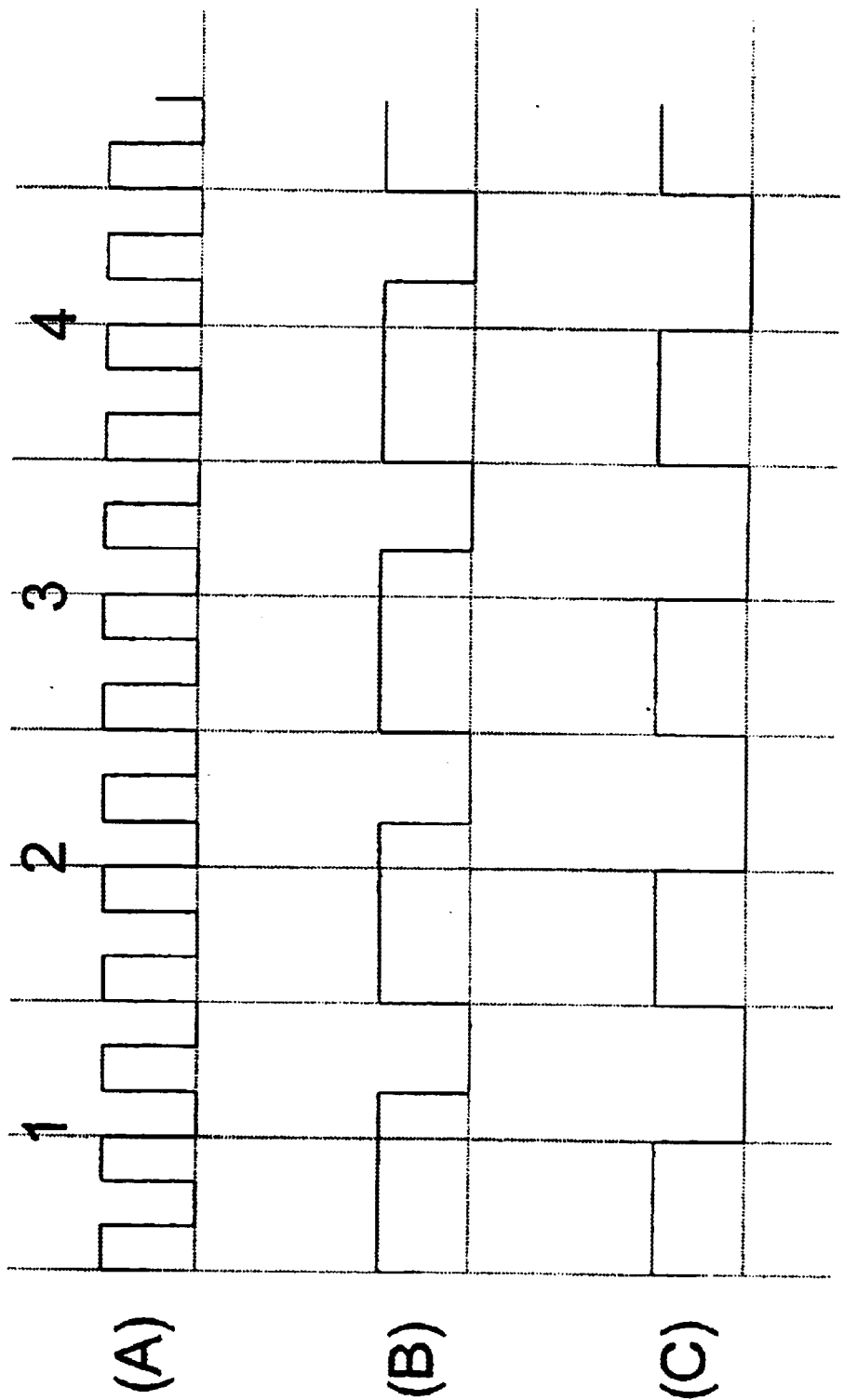
FIGS. 1A–1C illustrate a frequency divided signal having other than a 50% duty cycle, and one having a 50% duty cycle, wherein the division ratio for both signals is an odd integer.

The status quo is maintained until time $t_1$, at which time, as indicated in FIG. 11C, the input signal 301 undergoes a low-to-high transition. At the time this occurs, $\Phi B_1$ is low, so there is no immediate effect as transistor 405 is disabled. However, at time $t_2$, $\Phi B_1$ goes high, and transistor 405 begins to conduct. At the same time, transistor 406 is turned off (because DB is low), as are transistors 407 and 408 (because $\Phi_1$ is low). Consequently, as indicated in FIG. 11F, $I_2$ goes low, and, as indicated in FIG. 11D, $I_1$ goes high. As indicated in FIG. 11E, resistor 433 is such that the voltage drop across it is sufficient to drive node 424 to a low state. In addition, because $I_2$ is blocked, as indicated in FIG. 11G, node 423 rises to the high state. This state of affairs lasts until time $t_3$, when the signals $\Phi_1$ and $\Phi_2$ undergo a low-to-high transition. At this time, transistors 409 and 410 are enabled, and transistors 411 and 412 are disabled. Since node 423 is in the high state, transistor 409 begins conducting, and, as indicated in FIG. 11H, $I_3$ goes high. In addition, since node 424 is low, transistor 410 is effectively an open circuit, and, as indicated in FIG. 1'J, current $I_4$ goes low. As indicated in FIG. 11I, resistor 431 is such that the voltage drop across it is sufficient to drive output signal 308 into a low state. In addition, because of the blockage of $I_4$, as indicated in FIG. 11K, output signal 307 rises to the high level.

Meanwhile, as $\Phi B_1$ goes low, transistors 405 and 406 are disabled, and transistors 407 and 408 are enabled. Since node 423 goes high, transistor 408 conducts, and $I_1$ continues to flow to ground through transistor 408. However, node 424 is low, and thus transistor 407 is effectively an open circuit. Consequently, $I_2$ continues to stay blocked.

Since both the MOD and Q output signals are high, the clock phase modules 413 and 414 (see FIG. 6) implement a phase reversal of the $\Phi_1$ and $\Phi_2$ signals in relation to the CK signal. This is indicated in FIG. 11B. However, this does not in and of itself cause any changes in the state of the signals depicted in FIGS. 11D–11K.

This state of affairs remains until time $t_4$, when, as indicated in FIG. 11C, the D data input signal undergoes a high-to-low transition. At that time, since the $\Phi_1$ and $\Phi_2$ signals are high, the transition does not have an effect until time $t_5$, when the $\Phi B_1$ and $\Phi_2$ signals go high. At that time, since the $\Phi B_1$ and $\Phi B_2$ signals are high, transistor 406 begins conducting, and, as indicated in FIG. 11F, $I_2$ goes high. Similarly, transistor 405 turns off, and, as indicated in FIG. 11D, $I_1$ goes low. As indicated in FIGS. 11E and 11G respectively, node 424 goes high, and node 423 goes low.

Figure 11:
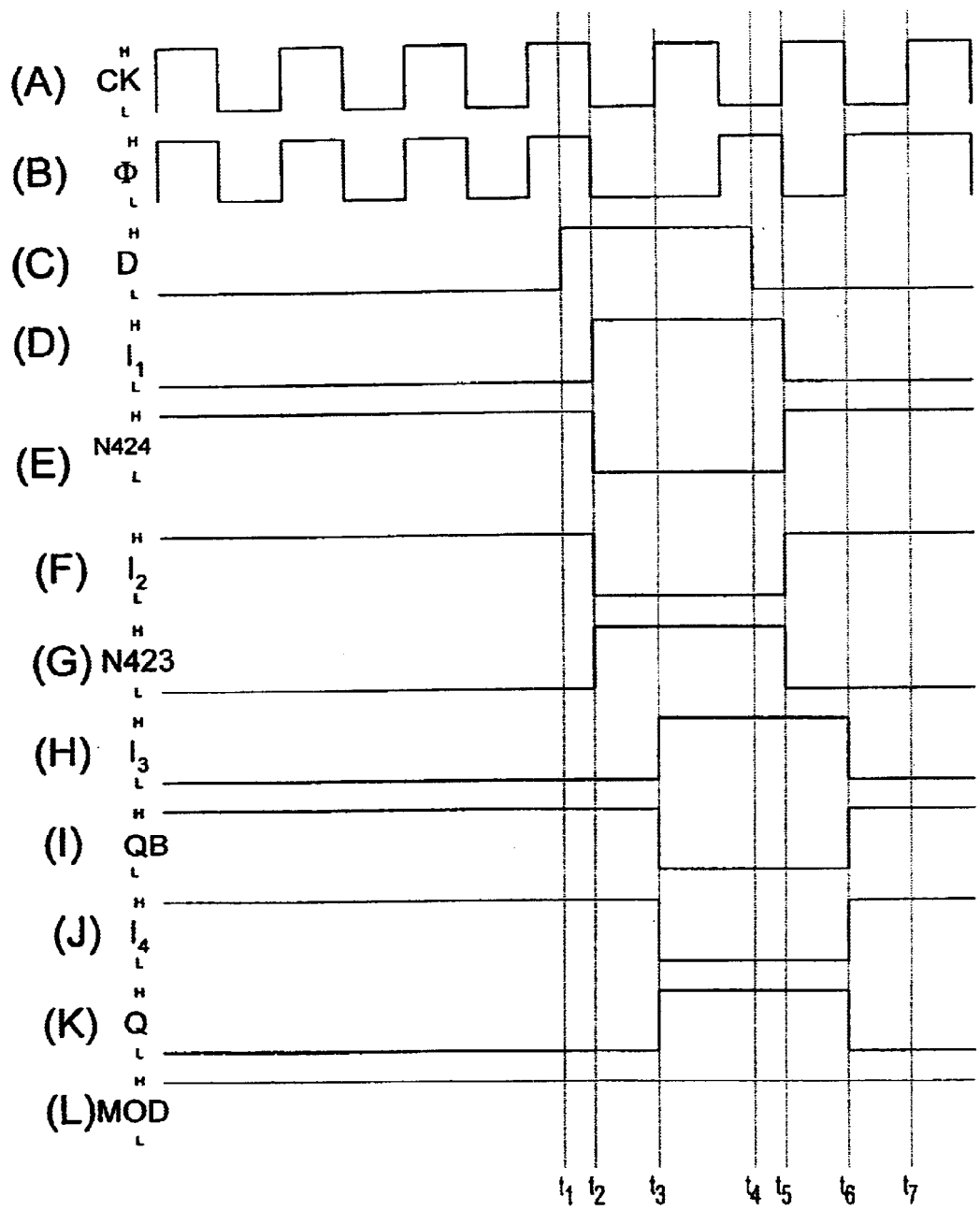

At time $t_6$, when $\Phi_1$ and $\Phi_2$ go high, transistor 410 begins conducting, and, as indicated in FIG. 11J, $I_4$ goes high. Similarly, at that time, transistor 409 is turned off, and, as indicated by FIG. 11H, $I_3$ goes low. As indicated in FIG. 11K, when $I_4$ goes high, the output signal Q is driven to a low state. Similarly, as indicated in FIG. 11I, when $I_3$ goes low, the output signal QB rises to the high state. At a time subsequent to $t_6$, designated $t_7$ in FIG. 11, the clock phase modules 413 and 414 detect that the Q output signal is low, and hence cancel the phase reversal of $\Phi_1$ and $\Phi_2$ in relation to CK. Subsequent to this time, then, as indicated by FIG. 11B, the signals $\Phi_1$ and $\Phi_2$ and CK have the same phase.

From the foregoing, it can be seen that, in the case in which MOD is high, for a low-to-high transition, the output signal Q transitions on the rising edge of CK, and for a high-to-low transition, the output signal Q transitions on the falling edge of CK.

Figure 7:
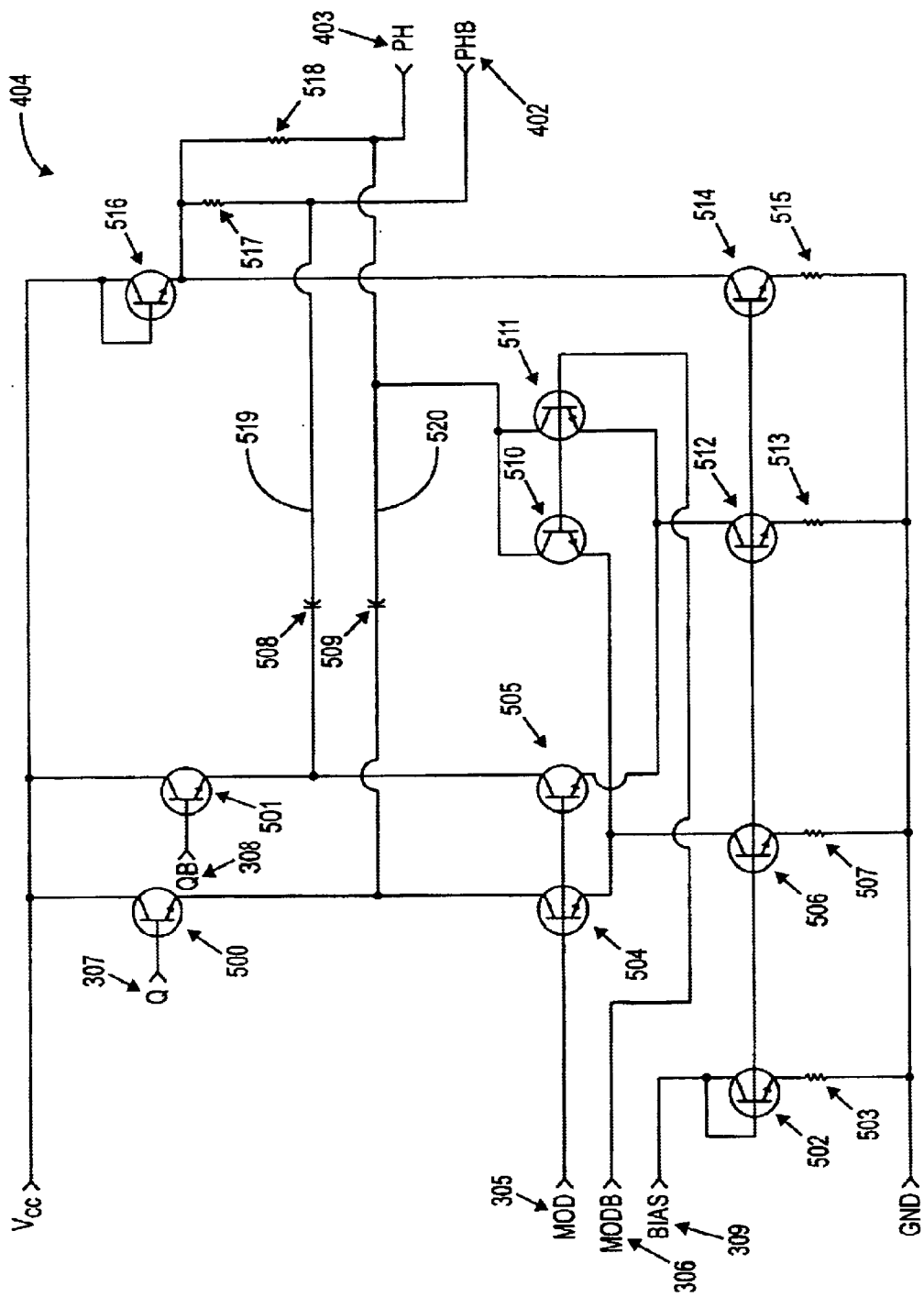

FIG. 7 illustrates an implementation example of module 404 in FIG. 6. As illustrated, the BIAS signal, identified with numeral 309, is coupled to the collector of transistor 502, which is in turn coupled to its base. The emitter of transistor 502 is coupled to ground through resistor 503. Similarly, the BIAS signal is also coupled to the bases of transistors 506, 512, and 524, the emitters of which are coupled to ground through resistors 507, 513, and 515 respectively.

The MOD signal, identified with numeral 305, is coupled to the bases of transistors 504 and 505. The MODB signal, identified with numeral 306, is coupled to the bases of transistors 510 and 511. The emitter of transistor 504 is coupled to the collector of transistor 506, and to the emitter of transistor 510. The emitter of transistor 505 is coupled to the collector of transistor 512 and to the emitter of transistor 511.

The Q signal, identified with numeral 307, is coupled to the base of transistor 500, and the QB signal, identified with numeral 308, is coupled to the base of transistor 501. The collectors of both of these transistors are coupled to $V_{CC}$. The emitter of transistor 500 is coupled to the collector of transistor 504, and to DC blocking capacitor 509, which in turn is coupled to signal line 520 on which is generated the signal PH, identified with numeral 403. The emitter of transistor 501 is coupled to the collector of transistor 505, and to DC blocking capacitor 508, which in turn is coupled to signal line 519 on which is provided the signal PHB, identified with numeral 402.

The collectors of transistors 510 and 511 are coupled together and to signal line 520. The base of transistor 516 is coupled to its collector which in turn is coupled to $V_{CC}$. The emitter of transistor 516 is coupled to signal line 519 through resistor 517, and to signal line 520 through resistor 518.

The BIAS signal determines whether the module 404 is turned on or off. When the BIAS signal is low, each of the transistors 502, 506, 512, and 514 is placed in a non-conducting state. Consequently, no current can flow from $V_{CC}$ through any of transistors 504, 505, 510, 511, 516. Similarly, no matter what the state of the Q and QB signals, little or no current flows from $V_{CC}$ through transistors 500 and 501 because of DC blocking capacitors 508 and 509, and also because the bases of transistors such as transistors 200a, 200b, 200c, and 200d (see FIG. 4) to which the signals PH and PHB are coupled to draw very little current. Hence, little or no power is consumed by the module.

When the BIAS signal is asserted high, the module turns on. The signals PH and PHB are normally high signals. However, when MODB is asserted high (indicating an even division ratio), transistors 510 and 511 begin conducting, and draw current from $V_{CC}$ through transistor 516 and resistor 518. The result is to drive the PH signal to a logical low.

When MOD is asserted high (indicating an odd division ratio), transistors 504 and 505 begin conducting. When the Q signal is high, transistor 500 begins conducting, and transistor 504 draws current from $V_{CC}$ through transistor 500. Consequently, little or no current is drawn through transistor 516 and resistor 518, and the PH signal goes to a high state. Transistor 505, however, draws current through transistor 516 and resistor 517, thus driving the PHB signal to a logical low.

When the QB signal is high, transistor 501 begins conducting, and transistor 505 draws current through it, and draws little or no current through transistor 516 and resistor 517. Consequently, the PHB signal goes high. However, transistor 504 draws current through transistor 516 and resistor 518, thus driving the PH signal to a logical low.

Figure 8:
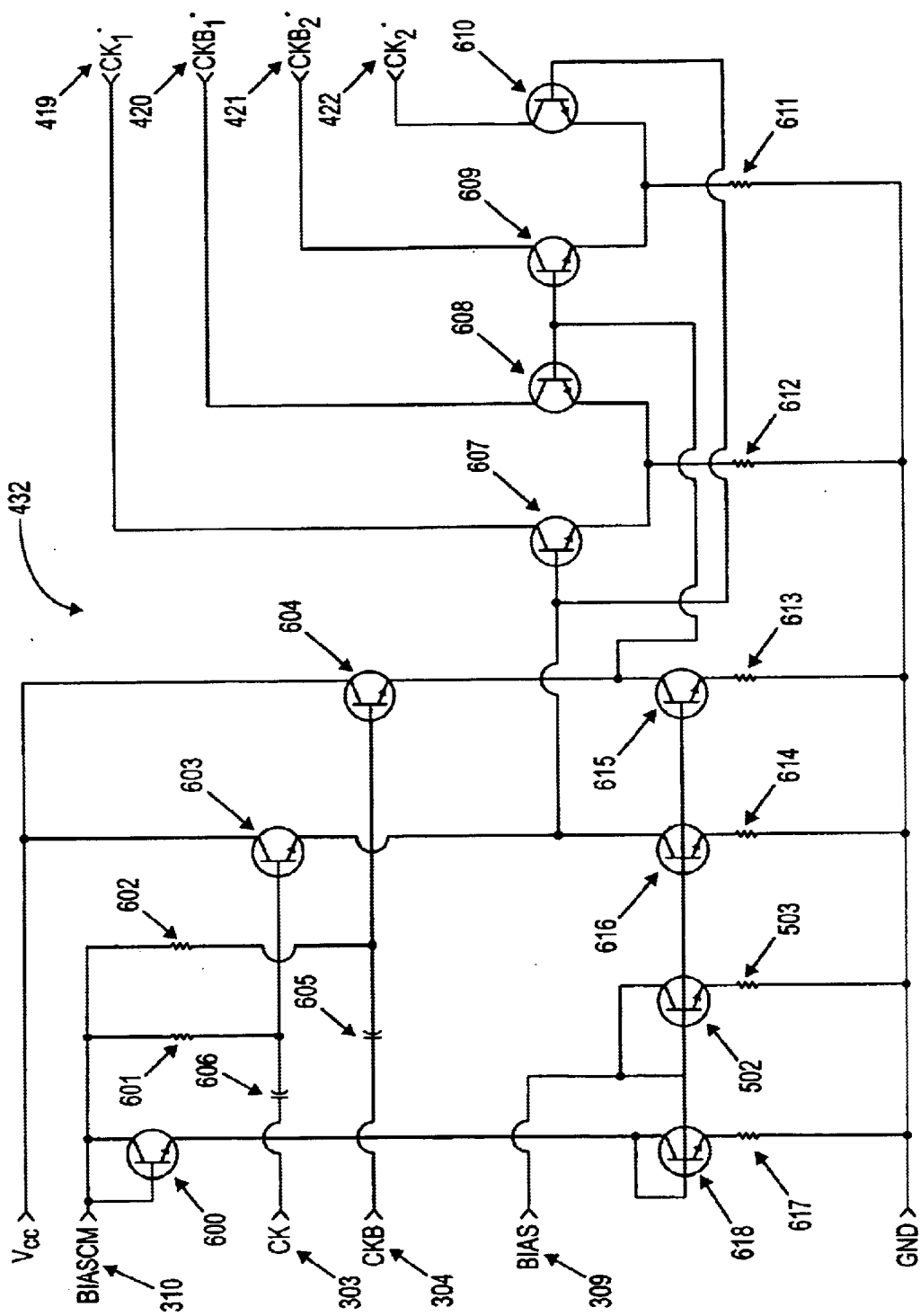

An implementation example of module 432 (see FIG. 6) is illustrated in FIG. 8. The BIAS signal is coupled to the bases of transistors 502, 616 and 615. The collector of transistor 502 is coupled to its base, and the emitter thereof is coupled to ground through resistor 503. The emitter of transistor 616 is coupled to ground through resistor 614, and the emitter of transistor 615 is coupled to ground through resistor 613.

The BIASCM signal is coupled to the base of transistor 600, which is also coupled to its collector. The emitter of transistor 600 is coupled to the collector of transistor 618 which is also coupled to its base. The emitter of transistor 618 is coupled to ground through resistor 617. The collector of transistor 600 is also coupled to one end of resistor 601, and to one end of resistor 601.

The CK signal, identified with numeral 303, is coupled to one end of capacitor 606, the other end of which is coupled to resistor 601 at one end, and to the base of transistor 603. The CKB signal, identified with numeral 304, is coupled to one end of capacitor 605, the other end of which is coupled to one end of resistor 602, and to the base of transistor 604.

The collectors of transistors 603 and 604 are coupled to $V_{CC}$. The emitter of transistor 603 is coupled to the collector of transistor 616, and to the bases of transistors 607 and 610. The emitter of transistor 604 is coupled to the collector of transistor 615, and to the bases of transistors 608 and 609. The emitters of transistors 607 and 608 are coupled together and to ground through resistor 612. The emitters of transistors 609 and 610 are coupled together and to ground through resistor 611.

The collector of transistor 607 forms the signal $CK_1^*$, identified with numeral 419. The collector of transistor 608 forms the signal $CKB_1^*$, identified with numeral 420. The collector of transistor 609 forms the signal $CKB_2^*$, identified with numeral 421. The collector of transistor 610 forms the signal $CK_2^*$, identified with numeral 422.

The overall function of module 432 is to convert the voltage mode signals CK and CKB to the current mode signals $CK_1^*$, $CKB_1^*$, $CK_2^*$, and $CKB_2^*$. The BIAS signal controls whether the module 432 is turned on or off. When the BIAS signal is low, current cannot flow through transistors 603 and 604, and the module is disabled. In this state, the module draws very little current. However, when this signal is high, current can flow through these transistors, and the module is enabled.

The BIASCM signal determines the common mode which is added to the differential signals CK and CKB. More specifically, transistor 603 receives the signal CK, adds a common mode component as determined by BIASCM, and provides the biased signal to the bases of transistors 607 and 610. Similarly, transistor 604 receives the signal CKB, adds a common mode component as determined by BIASCM, and provides the biased signal to the bases of transistors 608 and 609.

The biased signals provided to the bases of transistors 607, 608, 609, and 610 are still voltage mode signals. The function of these transistors is to convert these signals to current mode signals. Hence, when the signal applied to the bases of transistors 607 and 610 is high, corresponding to the CK signal going high, transistors 607 and 610 conduct, and current mode signals $CK_1^*$ and $CK_2^*$ are asserted high. Similarly, when the signal applied to the bases of transistors 608 and 609 is high, corresponding to the CKB signal going high, transistors 608 and 609 conduct, and current mode signals $CKB_1^*$ and $CKB_2^*$ are asserted high.

It should be appreciated that, while the foregoing implementation examples are described in terms of bipolar technology, other example implementations are possible in which other technologies are used, including MOS, HBT, SiGe, and CMOS technologies.

In one example application, the frequency divider of the subject invention is a component of a frequency synthesizer which in turn is a component of a transceiver. The transceiver may also be part of a wireless communications device, including a mobile wireless communications device such as a handset, laptop, or palm pilot. The wireless communications device may also be a component of a wireless communications system of the type in which a geographical area is divided into a plurality of cells, and a base station is situated within each of the cells, The base station communicates with and services wireless communications devices, including mobile wireless communications devices such as handsets, over a wireless interface. One or more of the wireless communications devices or base stations in the system may incorporate a transceiver configured in accordance with the subject invention.

Figure 12A:
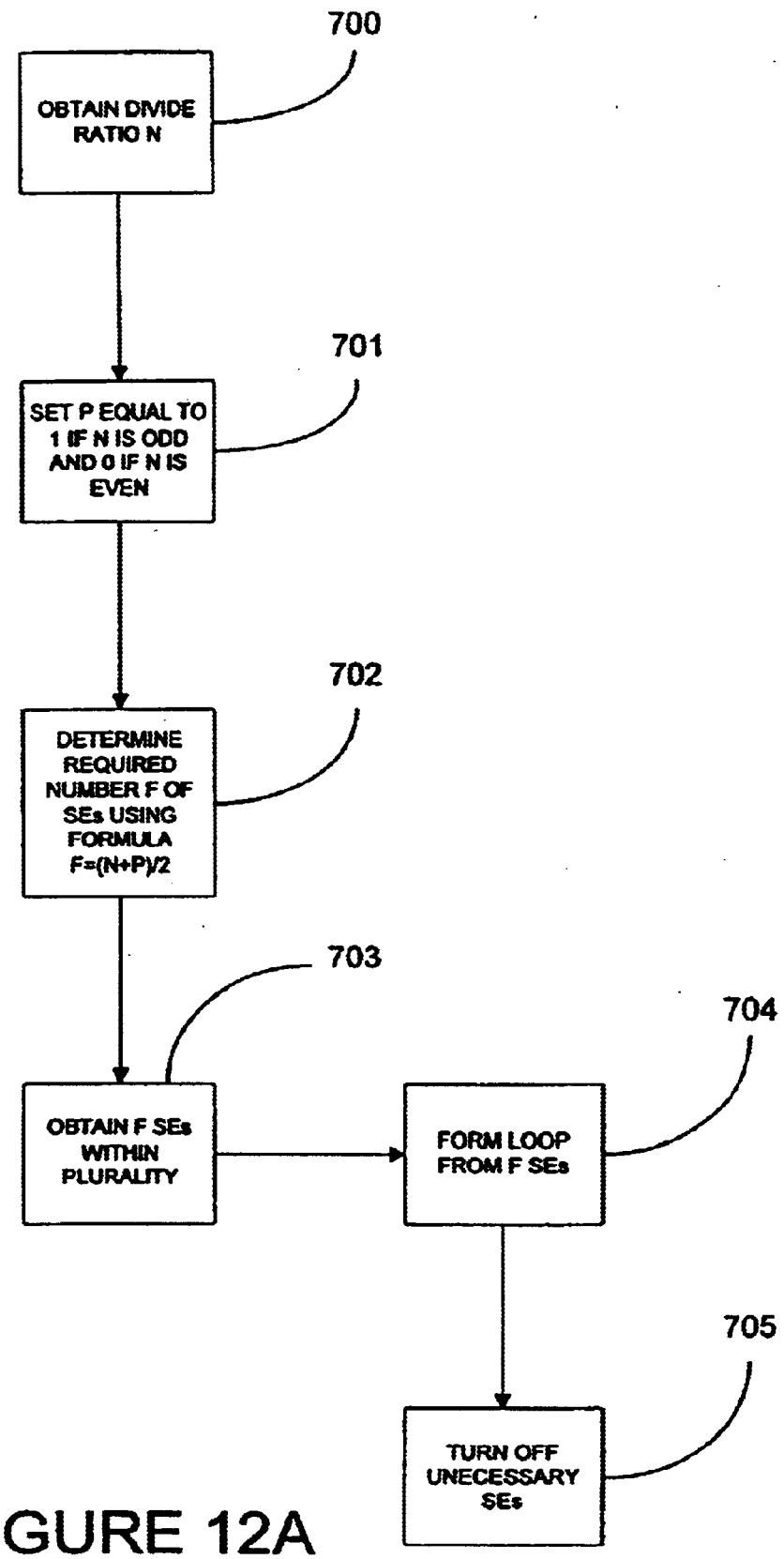
FIGS. 12A–12C are embodiments of methods of the subject invention.

FIG. 12A is a flowchart illustrating a method of configuring a frequency divider in accordance with the subject invention. In step 700, the desired division ratio N is determined. In step 701, a parameter P is set to 1 if the desired division ratio is odd, and to 0 if the desired division ratio is even.

In step 702, the required number F of storage elements is determined using the formula:

$$F = \frac{N+P}{2}$$

In step 703, F elements in a plurality of elements are identified, wherein the number of elements in the plurality may exceed F.

In step 704, a loop is formed from the F elements. In one embodiment, this is accomplished by coupling, for all but a selected element, the data input of an element to the data output of the preceding element, and, for the selected element, coupling the data input of the element to the inverse of the data output of the previous element. The inverse of the data output of the previous element may be obtained either through an inverter, or by suitable routing of the differential output lines of the previous element. In a second embodiment, the loop is configured to have an odd number of inversions. Again, an inversion may be accomplished either through an inverter, or by suitable routing of the differential output lines of the previous element.

In optional step 705, any unnecessary elements in the sequence are turned off.

Figure 12B:
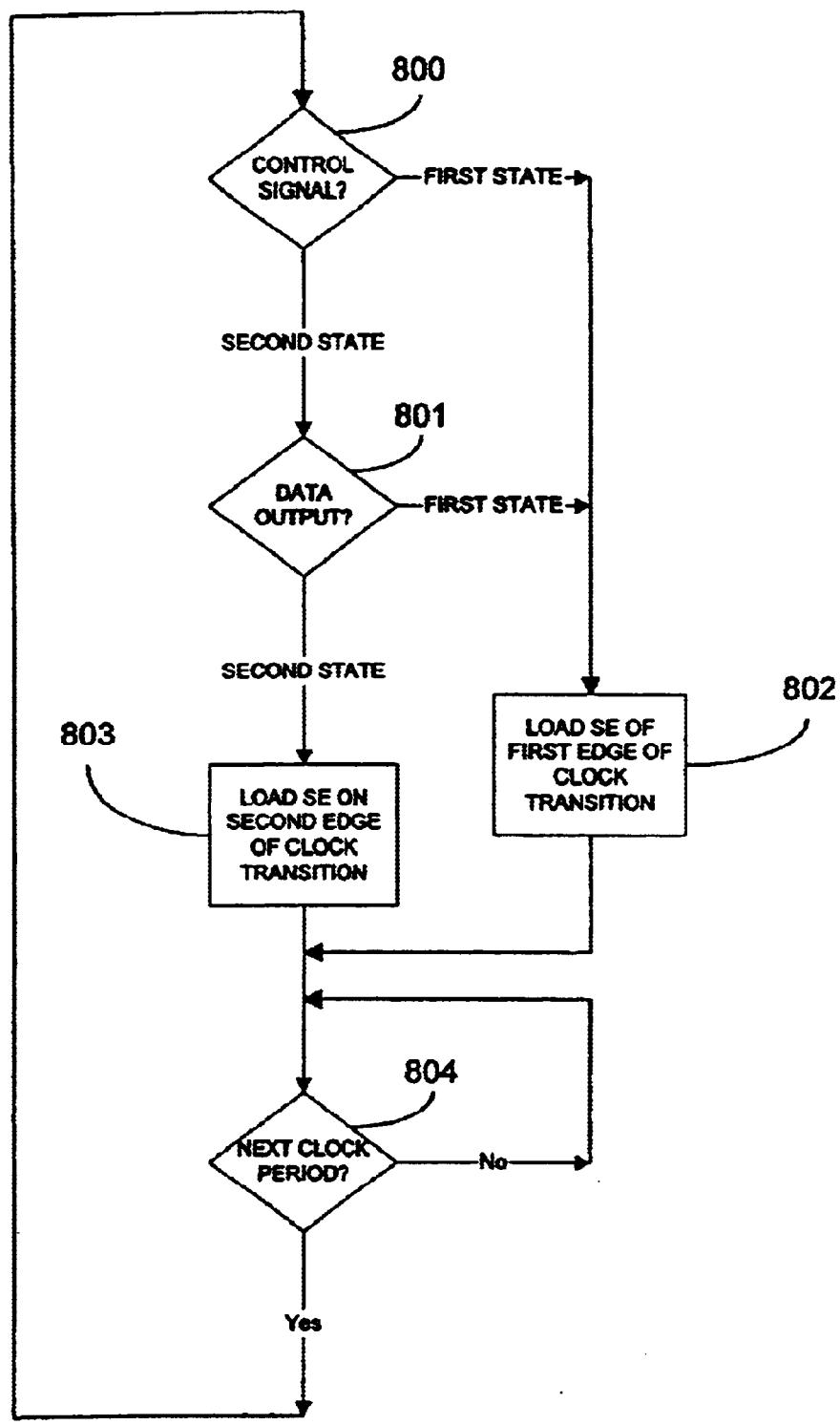

FIG. 12B illustrates a method of operation of a storage element in accordance with the subject invention. In step 800, a determination is made whether a control signal is in a first state or a second state. If in the first state, a jump is made to block 802. If in the second state, step 801 is performed. In step 801, a determination is made whether the data output of the storage element is in a first state or a second state. If in a first state, a jump is made to block 802. If in the second state, a jump is made to block 803.

In block 802, if the data input thereof has changed, the storage element triggers on the next first clock transition. In block 803, again if the data input thereof has changed, the storage element triggers on the next second clock transition.

Step 804 is then performed. In step 804, a determination is made whether the next clock period has begun. If not, a loop is made back to the beginning of step 804. If so, a jump is made to the beginning of step 800.

Figure 12C:
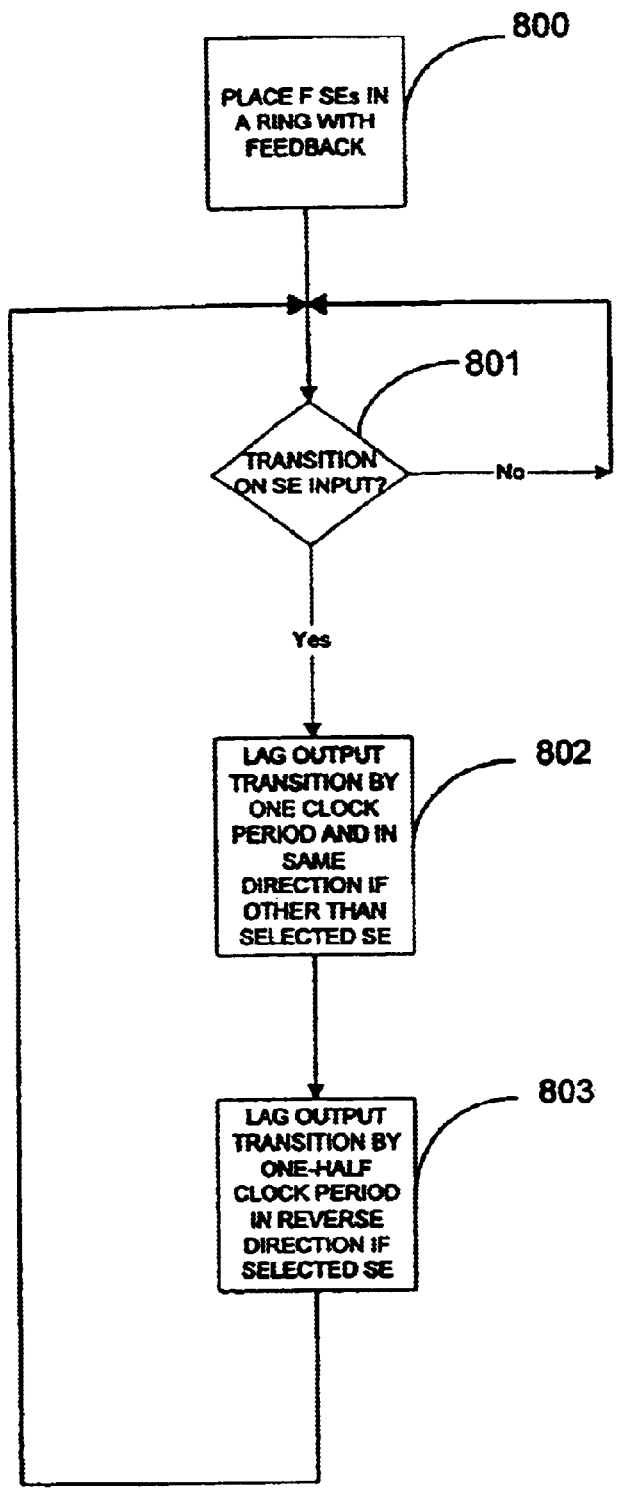

A method of operation of a frequency divider in accordance with the subject invention is illustrated in FIG. 12C. In step 800, the required number of stages F are placed in a ring, such that the input to a given stage is an output from a previous stage, and the input to the first stage is an output from the last stage.

In step 801, a determination is made whether there is a transition of the input to one of the stages. If not, a loop is made to the beginning of step 801. If so, step 802 is performed.

In step 802, if the given stage is other than a selected stage in the ring, the given stage produces a transition on its output signal which lags that of its input signal by one full clock cycle and which is in the same direction, either low-to-high or high-to-low, as that transition. In one embodiment, the selected stage is the first stage. Step 803 is then jumped to.

In step 803, if the given stage is the selected stage in the ring, the given stage produces a transition on its output signal which lags that of its input signal by one-half a clock cycle and which is in the opposite direction as that transition.

A jump is then made to the beginning of step 801, wherein the process repeats itself at that point.

While embodiments, implementations, examples, configurations, and methods have been illustrated and described, it should be appreciated that many more embodiments, implementations, examples, configurations, and methods are possible that are within the scope of the invention. Accordingly, the subject invention is not to be limited except in light of the following claims and their equivalents.

What is claimed is:

1. A frequency divider configured to provide an output signal having a period equal to a period of a clock signal multiplied by a division ratio, the frequency divider comprising:

a plurality of edge-triggered storage elements arranged in at least one loop, wherein each storage element has a state, and a clock input, wherein the state of each storage element is determined responsive to a transition of the clock input, the state, or the inverse thereof, of one or more previous storage element in the loop, a characteristic of the division ratio, and the previous state, or the inverse thereof, of said each storage element, and the output signal is derived from the state, or the inverse thereof, of at least one of the other storage elements in the loop, wherein each storage element is configured to normally trigger on a first edge of the clock signal, and to trigger on a second edge of the clock signal when a control signal indicative of the characteristic of the division ratio is in a first predetermined state and the data output of said each storage element is in a second predetermined state, wherein the first edge is selected from a group comprising a positive edge and a negative edge, and the second edge is selected from the group comprising a positive edge and a negative edge, and is other than that of the first edge.

2. The frequency divider of claim 1 wherein the loop is configured such that there are an odd number of loop inversions in the loop.

3. The frequency divider of claim 2 wherein the loop inversions are implemented with inverters.

4. The frequency divider of claim 3 wherein the loop inversions are implemented through suitable routing of differential mode lines or signals.

5. The frequency divider of claim 2 wherein the division ratio N is an integer programmable variable, and the number F of storage elements in the sequence bears the following relationship to N, the division ratio, and P, an indicator which is 1 when the division ratio is odd, and 0 when the division ratio is even:

$$F = \frac{N+P}{2}.$$

6. The frequency divider of claim 1 wherein the first predetermined state is selected from a group comprising a state indicating that the division ratio is an odd integer, and a state indicating that the division ratio is an even integer, and the second predetermined state is selected from a group comprising a logical high state and a logical low state.

7. The frequency divider of claim 6 wherein the first predetermined state indicates that the division ratio is an odd integer, and the second predetermined state is a logical high state.

8. A frequency synthesizer incorporating the frequency divider of claim 1.

9. A translation loop based transmitter incorporating the frequency divider of claim 1.

10. A transceiver incorporating the frequency synthesizer of claim 8.

11. A wireless communications device incorporating the transceiver of claim 10.

12. A mobile wireless handset incorporating the transceiver of claim 10.

13. A wireless communications system of the type in which a geographical area is divided into a plurality of cells, a base station is associated with each of the cells, and the base station is configured to communicate over a wireless communications interface with one or more mobile communications devices within the cell, wherein at least one of the base stations or mobile devices in the system incorporate the transceiver of claim 10.

14. A method of operation of a storage element in a frequency divider configured to provide an output signal having a period equal to N times the period of a clock signal, wherein N is a division ratio, comprising the steps of:

triggering upon a first edge of the clock signal when the division ratio N has a first predetermined characteristic or when a data output of the storage element is in a first predetermined state; and triggering upon a second edge of the clock signal when the division ratio N has a second predetermined characteristic and the data output of the storage element is in a second predetermined state, wherein the first edge is selected from a group comprising a positive edge and a negative edge, and the second edge is selected from the group comprising a positive edge and a negative edge, and is other than that of the first edge.

15. The method of claim 14 wherein the first predetermined characteristic of the division ratio N is that it is an even integer, and the second predetermined characteristic of the division ratio N is that it be an odd integer.

16. The method of claim 14 wherein the data output of the storage element is selected from the group comprising a logical high and a logical low.

\* \* \* \* \*